(12) United States Patent
Kitade

(10) Patent No.: US 6,417,726 B1
(45) Date of Patent: Jul. 9, 2002

(54) SEMICONDUCTOR DEVICE CAPABLE OF ADJUSTING AN INTERNAL POWER SUPPLY POTENTIAL IN A WIDE RANGE

(75) Inventor: Osamu Kitade, Hyogo (JP)

(73) Assignee: Mitsubish Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/846,196

(22) Filed: May 2, 2001

(30) Foreign Application Priority Data

Dec. 18, 2000 (JP) ........................................ 2000-383245

(51) Int. Cl.$^7$ ............................................. H03K 17/72
(52) U.S. Cl. ........................................ 327/543; 327/525
(58) Field of Search ................................ 323/312, 315; 327/525, 530, 534, 535, 537, 538, 540, 541, 543, 545, 546

(56) References Cited

U.S. PATENT DOCUMENTS 6,281,734 B1 * 8/2001 McClure et al. ............ 327/308
6,331,962 B1 * 12/2001 Kobayashi et al. ......... 327/315

FOREIGN PATENT DOCUMENTS

JP          6-236966         8/1994

* cited by examiner

*Primary Examiner*—Jeffrey Zweizig
(74) *Attorney, Agent, or Firm*—McDermott, Will & Emery

(57) ABSTRACT

A reference potential is generated according to a potential Viconst output from a constant current control circuit, and an internal power supply potential is generated based on the reference potential. Fuse elements are provided in the constant current control circuit. Since the resistance value of a resistance circuit can be adjusted, an internal power supply potential can be adjusted in a wider range than that in a conventional circuit. Reduction in yield can be prevented in the case where a threshold voltage or the like is varied.

10 Claims, 23 Drawing Sheets

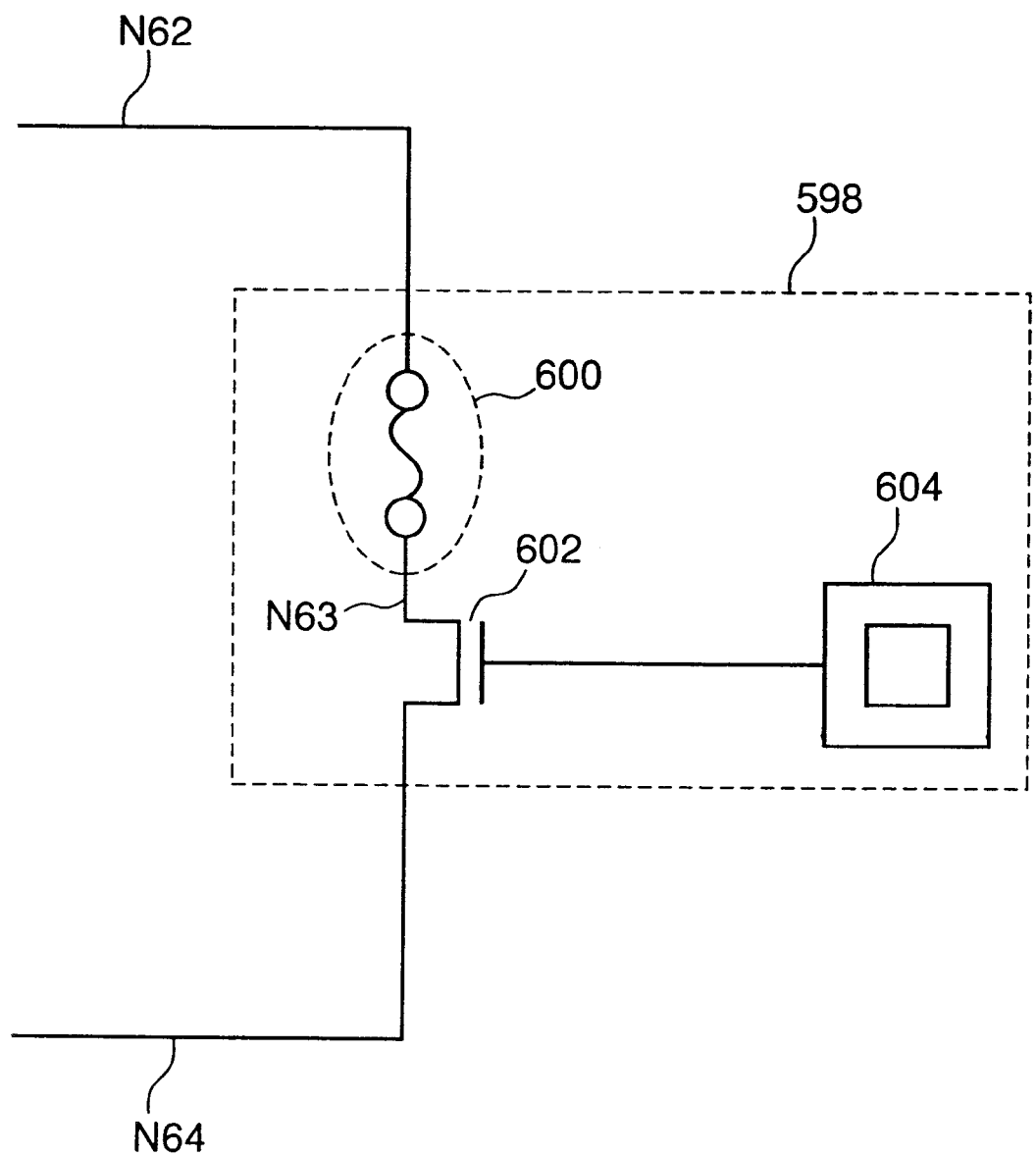

SEMICONDUCTOR DEVICE CAPABLE OF ADJUSTING AN INTERNAL POWER SUPPLY POTENTIAL IN A WIDE RANGE

BACKGROUND OF THE INVENTION

1. Field of the Invention

The present invention relates to a semiconductor device. More particularly, the present invention relates to a semiconductor device including a power supply circuit for generating an internal power supply potential from an externally applied potential.

2. Description of the Background Art

In general, semiconductor memory devices that are currently produced, in particular, dynamic random access memories Hereinafter, referred to as DRAMs), include an internal power supply generating circuit for stabilizing an external power supply potential by boosting or down-conversion so as to generate an internal power supply potential.

FIG. 22 is a block diagram showing the schematic structure of an internal power supply generating circuit 538 included in a conventional DRAM.

Referring to FIG. 22, the internal power supply generating circuit 538 includes a constant current control circuit 542 for outputting potentials V2, Viconst and Vbias, a reference potential generating circuit 544 for receiving the potentials V2 and Viconst and outputting a reference potential Vrefp, a Vccp generating circuit 546 for receiving the potential Vbias from the constant current control circuit 542 and the reference potential Vrefp from the reference potential generating circuit 544 and outputting an internal power supply potential Vccp, and an observing pad 548 connected to a node receiving the internal power potential Vccp, for monitoring a potential during wafer testing.

The internal power supply generating circuit 538 further includes a reference potential generating circuit 550 for receiving the potentials V2 and Viconst and outputting a reference potential Vrefa, a Vcca generating circuit 552 for receiving the potential Vbias and reference potential Vrefa and outputting an internal power supply potential Vcca, and a pad 554 connected to a node receiving the internal power supply potential Vcca, for observing a potential during wafer testing.

The internal power supply generating circuit 538 further includes a reference potential generating circuit 556 for receiving the potential V2 from the constant current control circuit 542 and outputting a reference potential Vref1, a VPP generating circuit 558 for outputting an internal power supply potential VPP according to the reference potential Vref1, and a pad 560 connected to a node receiving the internal power supply potential VPP, for observing a potential during wafer testing.

The internal power supply generating circuit 538 further includes a reference potential generating circuit 562 for receiving the potential Vbias and outputting a reference potential Vref2, a VBB generating circuit 564 for outputting an internal power supply potential VBB according to the reference potential Vref2, and a pad 556 connected to a node receiving the internal power supply potential VBB, for observing a potential.

The internal power supply potential Vccp is a power supply potential for peripheral circuitry that is supplied to an input/output (I/O) buffer of the DRAM, and the like. The internal power supply potential Vcca is a power supply potential that is supplied to a memory array and the like. The internal power supply potential VPP is a boosted potential for activating a word line of the memory array and the like. The internal power supply potential VBB is a negative potential that is supplied to the well where the memory array is formed, and the like.

FIG. 23 is a circuit diagram showing the structure of the constant current control circuit 542 of FIG. 22.

Referring to FIG. 23, the constant current control circuit 542 includes a resistance 572 connected between a node receiving an external power supply potential Vcc and a node N51, a P-channel MOS transistor 574 having its source connected to the node N51 and its gate and drain connected to a node N52, an N-channel MOS transistor 576 connected between the node N52 and a ground node and having its gate connected to a node N54, an N-channel MOS transistor 582 having its gate and drain connected to the node N54 and its source connected to the ground node, a P-channel MOS transistor 580 connected between a node N53 and the node N54 and having its gate connected to the node N52, and a resistance group 578 connected between the node receiving the power supply potential Vcc and the node N53. The potentials V2, Viconst and Vbias are output from the nodes N51, N52 and N54, respectively.

The resistance group 578 includes resistances 586.1 to 586.k connected in series between the node receiving the power supply potential Vcc and the node N53.

FIG. 24 is a diagram showing output potential characteristics of the constant current control circuit 542 of FIG. 23.

Referring to FIGS. 23 and 24, after the external power supply potential Vcc exceeds a threshold voltage|Vtp| of the P-channel MOS transistor, the potential Viconst rises with increase in power supply potential Vcc.

On the other hand, the potential Vbias rises with increase in power supply potential Vcc until the power supply potential Vcc reaches a threshold voltage Vtn of the N-channel MOS transistor. However, the potential Vbias becomes approximately constant after the power supply potential Vcc exceeds the threshold voltage Vtn.

FIG. 25 is a circuit diagram showing the structure of the reference potential generating circuit 544 of FIG. 22.

Referring to FIG. 25, the reference potential generating circuit 544 includes a P-channel MOS transistor 592 connected between a node receiving the potential V2 and a node N61 and receiving the potential Viconst at its gate, and a resistance circuit 594 connected between the node N61 and the ground node. The reference potential Vrefp is output from the node N61.

The resistance circuit 594 includes P-channel MOS transistors 596.1 to 596.j connected in series between the node N61 and the ground node and having their gates connected to the ground node, and fuse circuits 598.1 to 598.j connected in parallel with the P-channel MOS transistors 596.1 to 596.j, respectively.

The P-channel MOS transistor 592, which receives the potential Viconst at its gate, serves as a constant current source. Thus, a constant current flows into the resistance circuit 594, and the reference potential Vrefp is output according to the resistance value of the resistance circuit 594. This reference potential Vrefp is constant even if the external power supply potential Vcc varies.

The Vccp generating circuit 546 of FIG. 22 generates the internal power supply potential Vccp for output, based on the reference potential Vrefp thus stabilized at a constant value.

FIG. 26 is a circuit diagram showing the structure of the fuse circuit 598 used in FIG. 25.

Referring to FIG. 26, the fuse circuit 598 includes a fuse element 600 connected between nodes N62 and N63, and an N-channel MOS transistor 602 connected between the node N63 and a node N64 and having its gate connected to a pad 604. The fuse circuits 598.1 to 598.j of FIG. 25 have the same structure as that of the fuse circuit 598 of FIG. 26.

Conventionally, an internal power supply potential in the DRAM is adjusted during wafer testing.

More specifically, the fuse circuits 598.1 to 598.j of FIG. 25 are switched between conductive and non-conductive states by a test signal supplied from the respective pads 604 of FIG. 26, in order to vary the reference potential Vrefp. Then, the internal power supply potential Vccp is observed with the pad 548 of FIG. 22, and a fuse element 600 is blown according to the test signal that corresponds to an optimal internal power supply potential Vccp. The fuse element 600 is blown with laser beams.

For example, however, in the case where the transistor threshold voltage Vth becomes lower than the assumed value due to variation in process up to the wafer testing, there may be a lot including many chips that cannot tune the internal power supply potential to a desired set value. In such a case, an appropriate internal power supply potential cannot be obtained, resulting in a large number of defective products. Thus, the yield is reduced.

SUMMARY OF THE INVENTION

It is an object of the present invention to provide a semiconductor device capable of tuning, in a wide range, an internal power supply potential to a set value.

In summary, a semiconductor device according to the present invention includes a constant current control circuit, a reference potential generating circuit, and an internal power supply driving circuit.

The constant current control circuit receives an external power supply potential and outputs a first reference potential. The constant current control circuit includes a first resistance circuit having a first resistance value that is varied according to external setting, and a potential output portion for outputting the first reference potential according to the first resistance value.

The reference potential generating circuit outputs a second reference potential according to the first reference potential. The reference potential generating circuit includes a constant current source for outputting a constant current according to the first reference potential, and a second resistance circuit connected between the constant current source and a ground node, for outputting the second reference potential by flowing the constant current therethrough.

The internal power supply driving circuit receives the power supply potential and drives an internal power supply node according to the second reference potential.

Accordingly, a primary advantage of the present invention is that the internal power supply potential can be adjusted in a wide range by adjusting, with the external setting, the reference potential that is output from the constant current control circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 26 is a circuit diagram showing the structure of a fuse circuit 598 used in FIG. 25.

DESCRIPTION OF THE PREFERRED EMBODIMENTS

Figure 1:
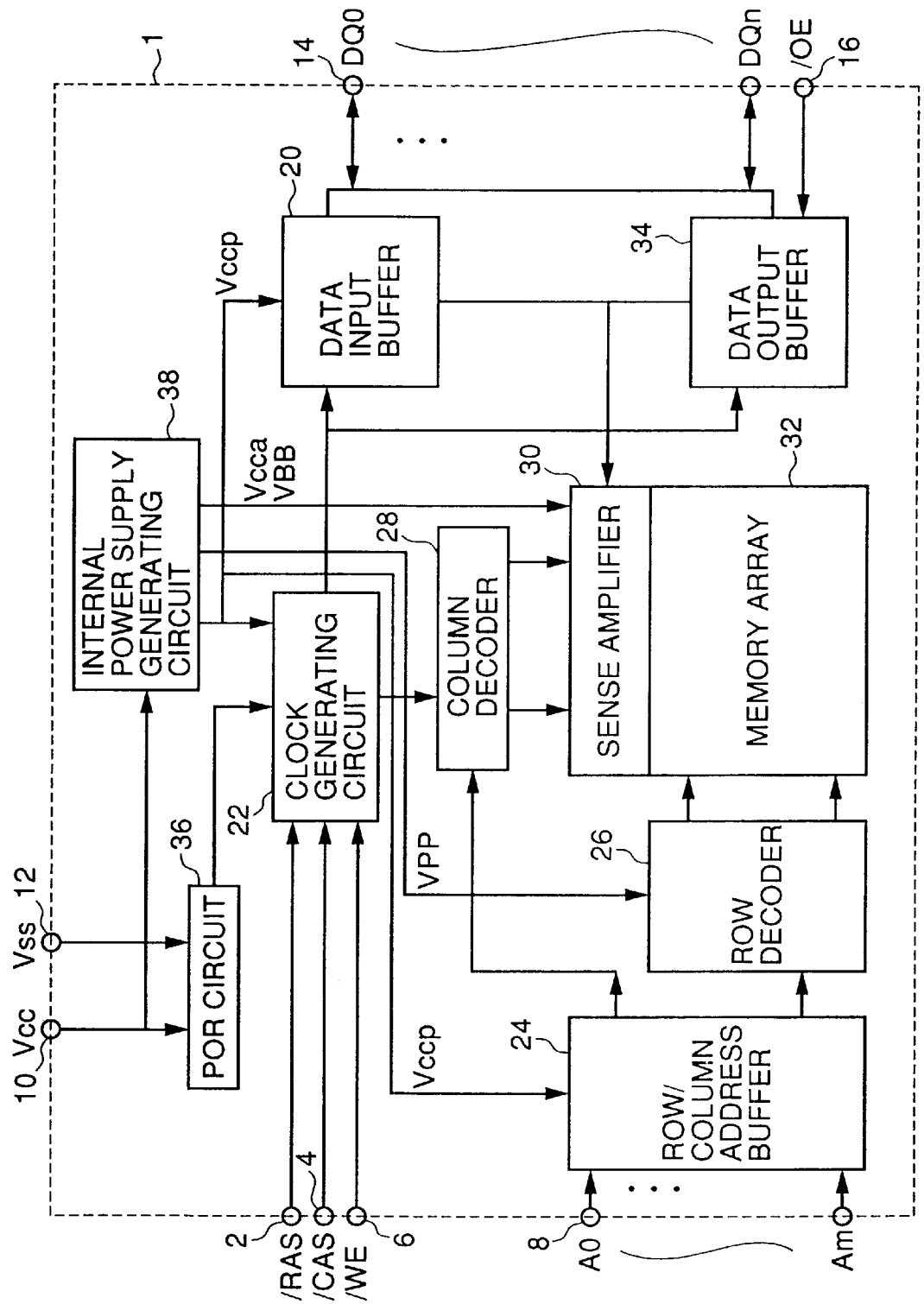
FIG. 1 is a schematic block diagram showing the structure of a semiconductor device 1 according to a first embodiment of the present invention.

Hereinafter, embodiments of the present invention will be described in detail with reference to the accompanying drawings. Note that, throughout the figures, the same reference numerals denote the same or corresponding portions.

First Embodiment

FIG. 1 is a schematic block diagram showing the structure of a semiconductor device 1 according to the first embodiment of the present invention.

Referring to FIG. 1, the semiconductor device 1 includes control signal input terminals 2, 4 and 6 for receiving control signals /RAS, /CAS and WE, respectively, an address terminal group 8 for receiving address signals A0 to Am, an input/output terminal group 14 of data signals DQ0 to DQn, an input terminal 16 for receiving an output enable signal /OE, a ground terminal 12 for receiving a ground potential Vss, and a power supply terminal 10 for receiving a power supply potential Vcc.

The semiconductor device 1 further includes a clock generating circuit 22, a row/column address buffer 24, a row decoder 26, a column decoder 28, a sense amplifier 30 and a memory array 32.

The semiconductor device 1 further includes a data input buffer 20 and a data output buffer 34, which transmit data between the memory array 32 and the terminal group 14 through the sense amplifier 30 under the control of the clock generating circuit 22.

The clock generating circuit 22 generates a control clock corresponding to a prescribed operation mode based on the row address strobe signal R and column address strobe signal /CAS that are externally applied through the respective control signal input terminals 2 and 4, and controls the overall operation of the semiconductor device.

The row/column address buffer 24 applies row and column address signals produced based on the external address signals A0 to Am (where m is a natural number) to the row decoder 26 and column decoder 28, respectively.

A memory cell in the memory array 32 that is designated by the row decoder 26 and column decoder 28 transmits and receives the data signals DQ0 to DQn to and from the outside via the terminal group 14 through the sense amplifier 30 and data input buffer 20 or data output buffer 34.

The semiconductor device 1 further includes a power-on reset (POR) circuit 36 for sensing supply of the power supply potential and outputting a reset signal, and an internal power supply generating circuit 38 for outputting internal power supply potentials Vccp, Vcca, VPP and VBB based on the power supply potential Vcc. The internal power supply potential Vccp is an internal power supply potential for peripheral circuitry that is supplied to the row/column address buffer 24, data input buffer 20 and data output buffer 34. The internal power supply potential VPP is an internal power supply potential that is applied to the row decoder 26 so as to serve as a potential for activating a word line. The internal power supply potential Vcca is a power supply potential for array that is applied to the memory array 32. The internal power supply potential VBB is a negative substrate potential that is applied to the well where the memory array 32 is formed.

Figure 2:
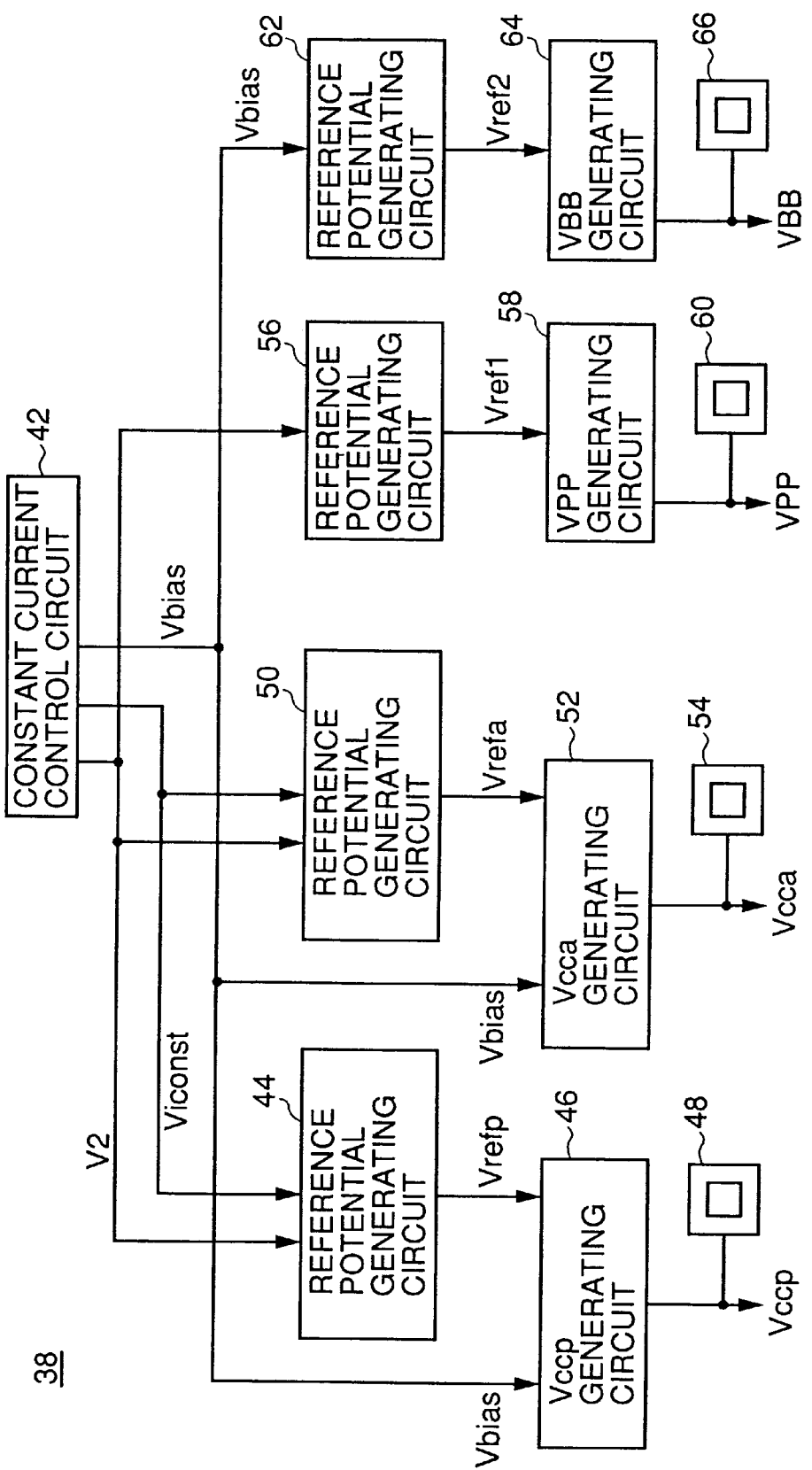
FIG. 2 is a block diagram showing the schematic structure of an internal power supply generating circuit 38 of FIG. 1.

FIG. 2 is a block diagram showing the schematic structure of the internal power supply generating circuit 38 of FIG. 1.

Referring to FIG. 2, the internal power supply generating circuit 38 includes a constant current control circuit 42 for outputting potentials V2, Viconst and Vbias, a reference potential generating circuit 44 for receiving the potentials V2 and Viconst and outputting a reference potential Vrefp, a Vccp generating circuit 46 for receiving the potential Vbias from the constant current control circuit 42 and the reference potential Vrefp from the reference potential generating circuit 44 and outputting the internal power supply potential Vccp, and an observing pad 48 connected to a node receiving the internal power supply potential Vccp, for monitoring a potential during wafer testing.

The internal power supply generating circuit 38 further includes a reference potential generating circuit 50 for receiving the potentials V2 and Viconst and outputting a reference potential Vrefa, a Vcca generating circuit 52 for receiving the potential Vbias and reference potential Vrefa and outputting the internal power supply potential Vcca, and a pad 54 connected to a node receiving the internal power supply potential Vcca, for observing a potential during wafer testing.

The internal power supply generating circuit 38 further includes a reference potential generating circuit 56 for receiving the potential V2 from the constant current control circuit 42 and outputting a reference potential Vref1, a VPP generating circuit 58 for outputting an internal power supply potential VPP according to the reference potential Vref2, and a pad 60 connected to a node receiving the internal power supply potential VPP, for observing a potential during wafer testing.

The internal power supply generating circuit 38 further includes a reference potential generating circuit 62 for receiving the potential Vbias and outputting a reference potential Vref2, a VBB generating circuit 64 for outputting an internal power supply potential VBB according to the reference potential Vref2, and a pad 66 connected to a node receiving the internal power supply potential VBB, for observing a potential.

Figure 3:
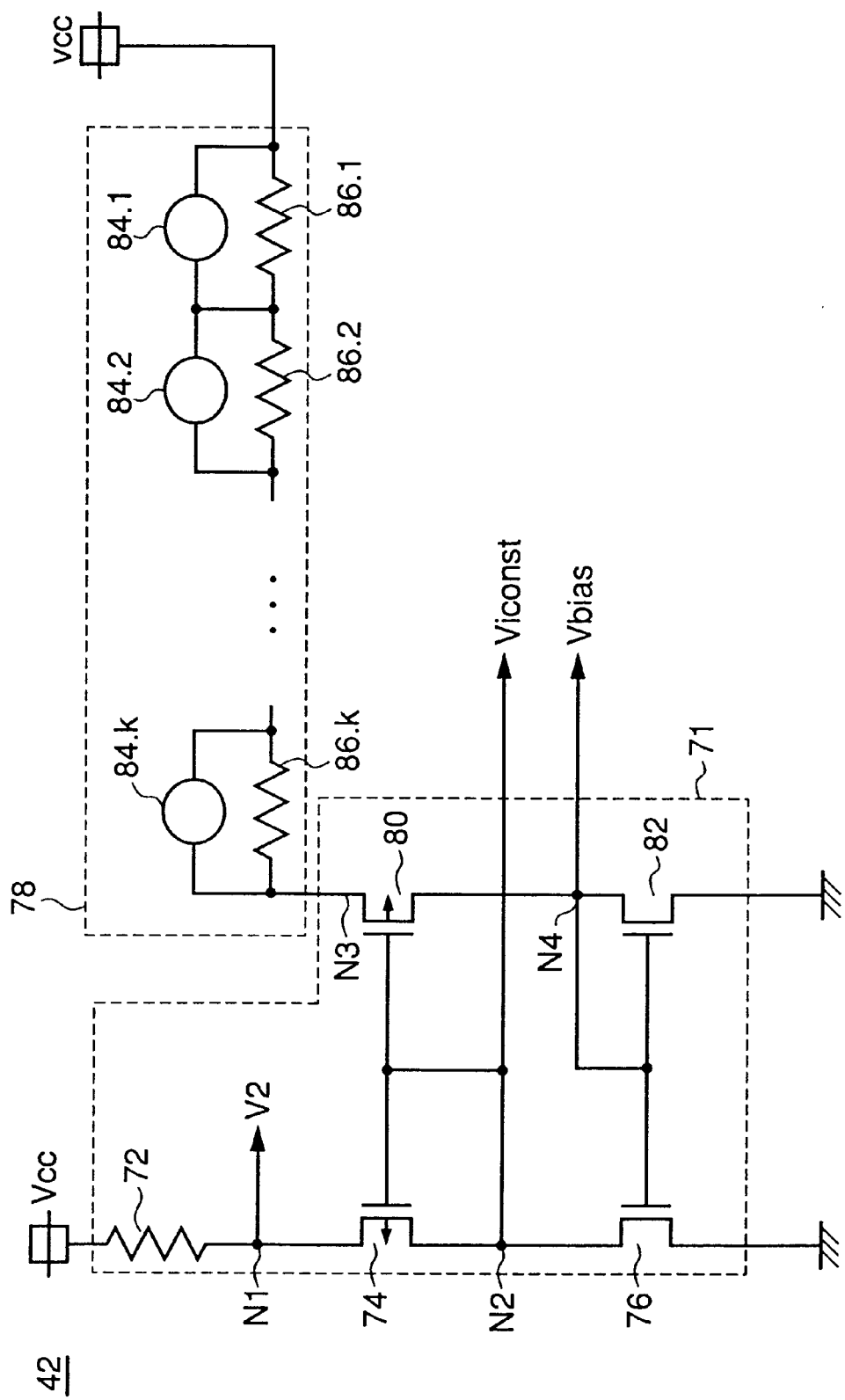
FIG. 3 is a circuit diagram showing the structure of a constant current control circuit 42 of FIG. 2.

FIG. 3 is a circuit diagram showing the structure of the constant current control circuit 42 of FIG. 2.

Referring to FIG. 3, the constant current control circuit 42 includes a resistance circuit 78 connected between a node receiving the power supply potential Vcc and a node N3, and a potential output portion 71 connected to the resistance circuit 78 at the node N3, for outputting the potentials V2, Viconst and Vbias.

The potential output portion 71 includes a resistance 72 connected between the node receiving the external power supply potential Vcc and a node N1, a P-channel MOS transistor 74 having its source connected to the node N1 and its gate and drain connected to a node N2, an N-channel MOS transistor 76 connected between the node N2 and a ground node and having its gate connected to a node N4, an N-channel MOS transistor 82 having its gate and drain connected to the node N4 and its source connected to the ground node, and a P-channel MOS transistor 80 connected between the nodes N3 and N4 and having its gate connected to the node N2. The potentials V2, Viconst and Vbias are output from the nodes N1, N2 and N4, respectively.

The resistance circuit 78 includes resistances 86.1 to 86.k connected in series between the node receiving the power supply potential Vcc and the node N3, and fuse elements 84.1 to 84.k connected in parallel with the resistances 86.1 to 86.k, respectively.

The fuse elements 84.1 to 84.k are thus connected in parallel with the series-connected resistances 86.1 to 86.k, respectively, so that the total resistance value of the resistance circuit 78 can be varied.

For example, it is now assumed that the resistance value of the fuse elements 84.1 to 84.k is small enough as compared to that of the resistances 86.1 to 86.k. In this case, if the fuse element 84.1 is blown with laser beams into non-conductive state, the resistance value of the resistance circuit 78 becomes approximately equal to that of the resistance 86.1

The respective resistance values of the resistances 86.1 to 86.k may be set to the same value. However, by, e.g., setting the respective resistance values of the resistances 86.1 to 86.k to different values like R, 2R, 4R, . . . , various resistance values can be realized with a smaller number of fuses and a smaller number of blowing of the fuses.

Figure 4:
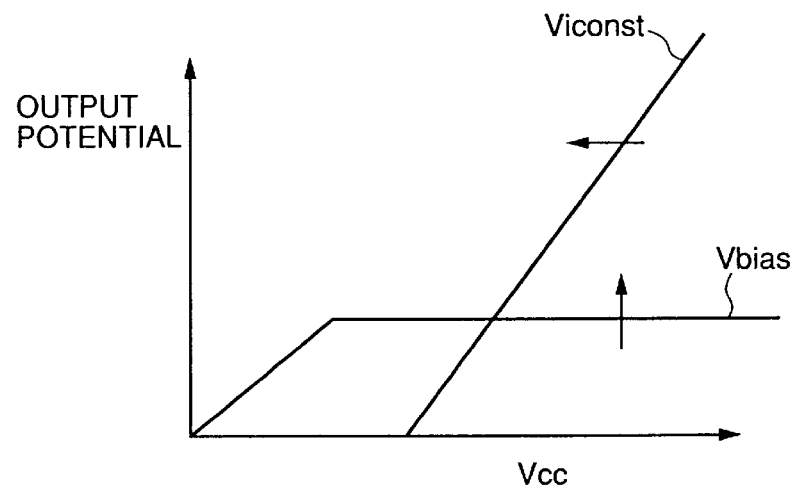
FIG. 4 is a diagram illustrating a change in output potentials of the constant current control circuit 42 of FIG. 3.

FIG. 4 is a diagram illustrating a change in output potentials of the constant current control circuit 42 of FIG. 3.

Referring to FIGS. 3 and 4, when the resistance value of the resistance circuit 78 is increased as a result of blowing any of the fuse elements 84.1 to 84.k, the potential Vbias that is output from the constant current control circuit 42 rises, whereas the potential Viconst is shifted to the left.

Figure 5:
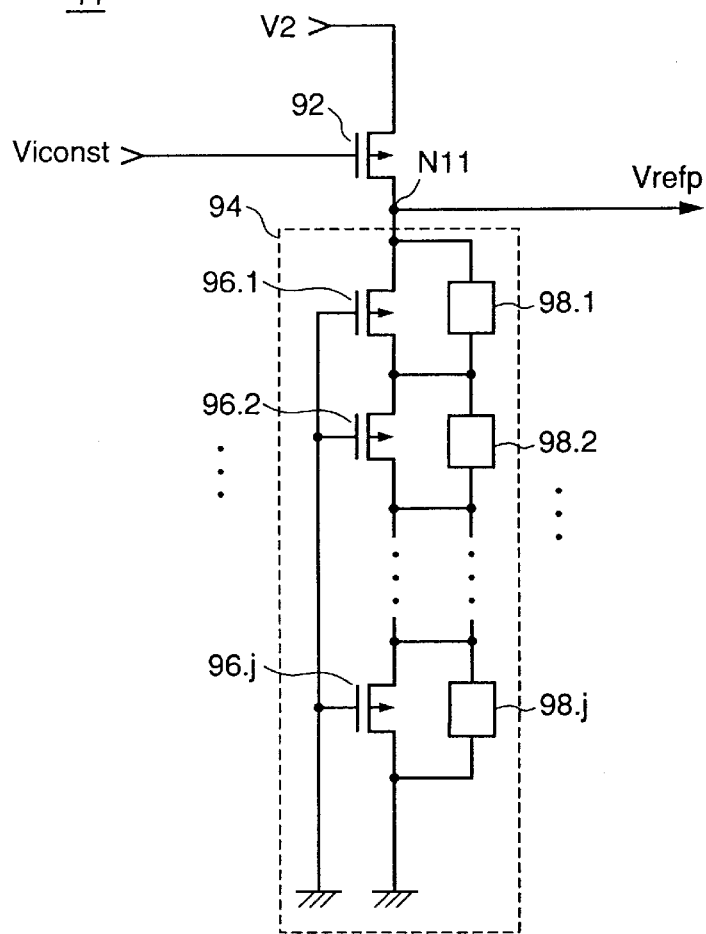
FIG. 5 is a circuit diagram showing the structure of a reference potential generating circuit 44 of FIG. 2.

FIG. 5 is a circuit diagram showing the structure of the reference potential generating circuit 44 of FIG. 2.

Referring to FIG. 5, the reference potential generating circuit 44 includes a P-channel MOS transistor 92 connected between a node receiving the potential V2 and a node N11 and receiving the potential Viconst at its gate, and a resistance circuit 94 connected between the node N11 and the ground node. The reference potential Vrefp is output from the node N11.

The resistance circuit 94 includes P-channel MOS transistors 96.1 to 96.j connected in series between the node N11 and the ground node and having their gates connected to the ground node, and fuse circuits 98.1 to 98j connected in parallel with the P-channel MOS transistors 96.1 to 96j, respectively. The P-channel MOS transistors 96.1 to 96.j serve as resistance elements when being in a conductive state.

The constant current control circuit 42 outputs the potential Viconst for causing a P-channel MOS transistor as a constant current source. Therefore, the P-channel MOS transistor 92, which receives the potential Viconst at its gate, serves as a constant current source. Thus, a constant current flows into the resistance circuit 94, and the reference potential Vrefp is output according to the resistance value of the resistance circuit 94. This reference potential Vrefp is constant even if the external power supply potential Vcc varies.

Figure 6:
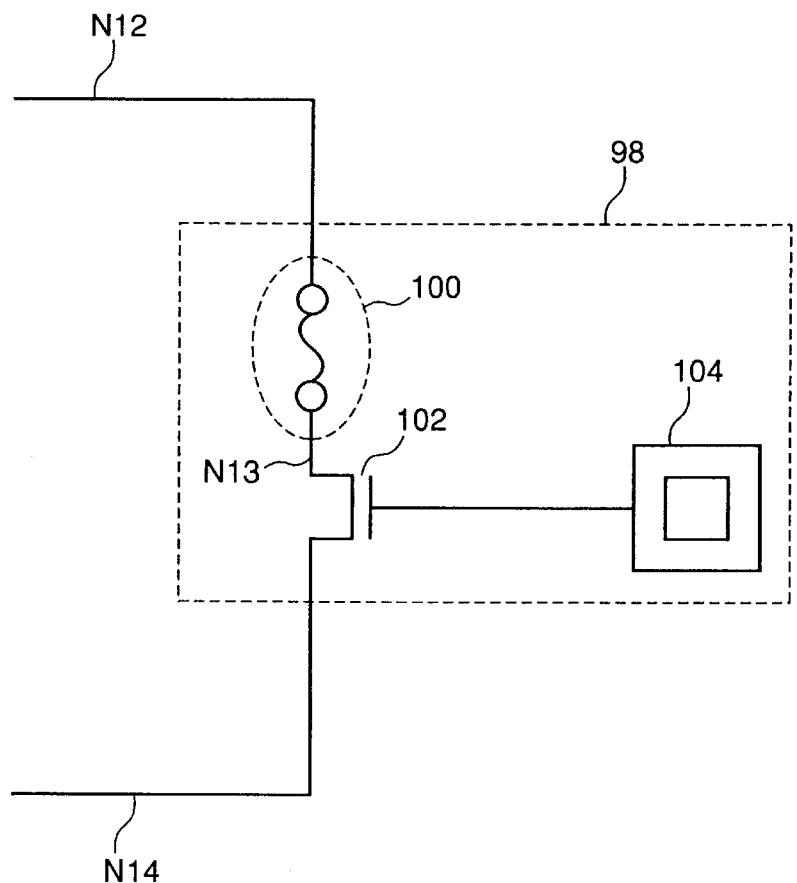
FIG. 6 is a circuit diagram showing the structure of a fuse circuit 98 used in the reference potential generating circuit 44 of FIG. 5.

FIG. 6 is a circuit diagram showing the structure of the fuse circuit 98 used in the reference potential generating circuit 44 of FIG. 5.

Referring to FIG. 6, the fuse circuit 98 includes a fuse element 100 connected between nodes N12 and N13, and an N-channel MOS transistor 102 connected between the node N13 and a node N14 and having its gate connected to a pad 104. The fuse circuits 98.1 to 98.j of FIG. 5 have the same structure as that of the fuse circuit 98 of FIG. C.

Figure 7:
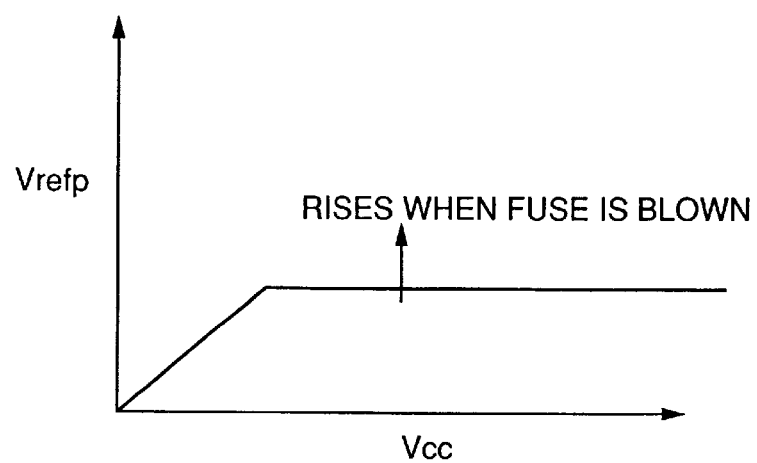
FIG. 7 is a diagram illustrating characteristics of a reference potential Vrefp that is output from the reference potential generating circuit 44.

FIG. 7 is a diagram illustrating characteristics of the reference potential Vrefp that is output from the reference potential generating circuit 44.

Referring to FIGS. 5 and 7, when the power supply potential Vcc reaches a prescribed value or more, the P-channel MOS transistor 92 serves as a constant current source. Accordingly, a constant current Iconst flows from the node N11 toward the ground node. Thus, the reference potential Vrefp is determined according to the resistance value of the resistance circuit 94. The current Iconst is approximately constant even if the power supply potential Vcc rises. Therefore, the reference potential Vrefp is also approximately constant.

Herein, the fuse circuits 98.1 to 98.j can be selectively opened by a test signal applied to the pad 104 of FIG. 6. Accordingly, it is known that a fuse included in which of the fuse circuits 98.1 to 98.j should be blown in order to obtain an optimal reference potential Vrefp. If the fuse is blown into non-conductive state, the resistance value of the resistance circuit 94 is increased, whereby the reference potential Vrefp is raised.

Figure 8:
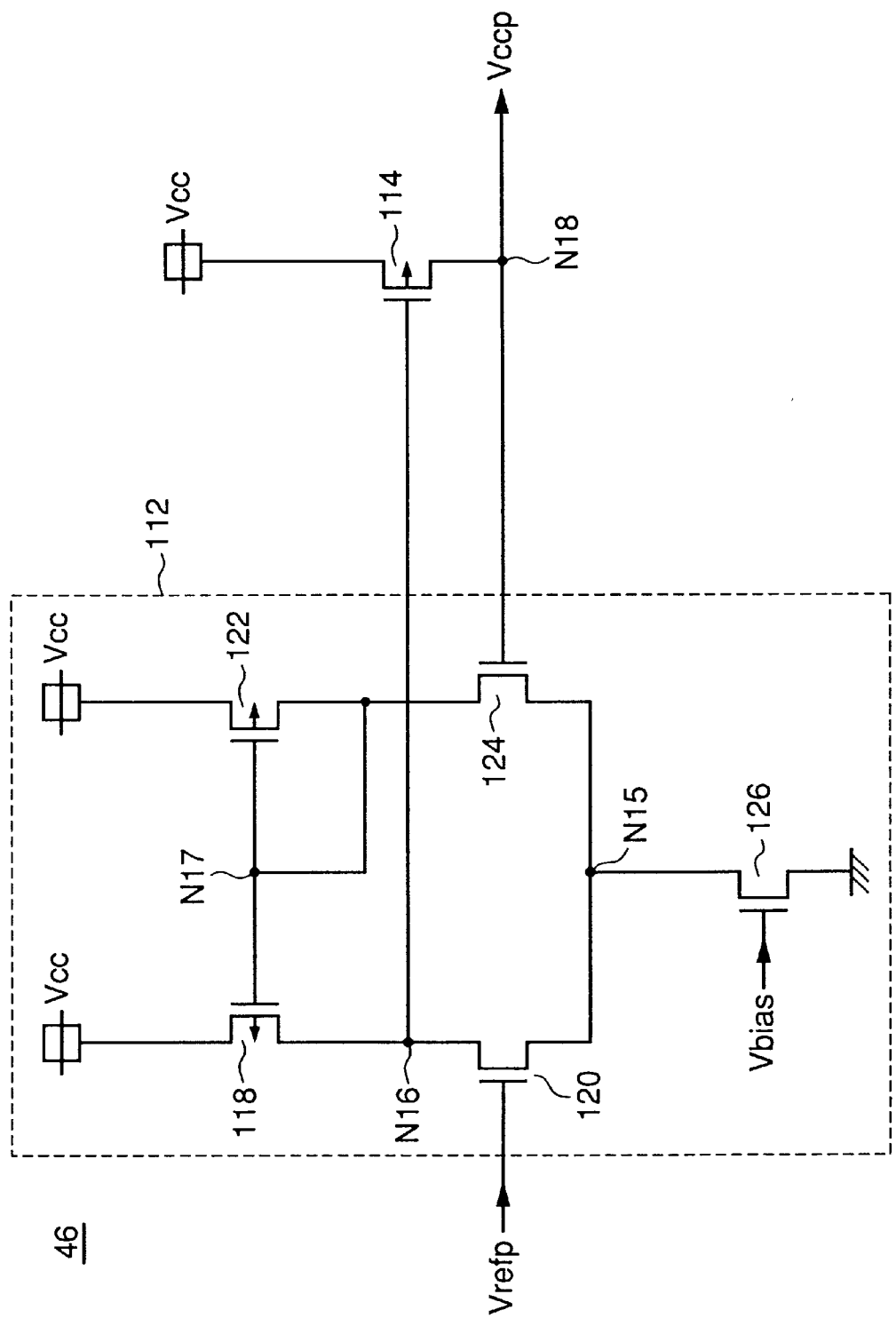
FIG. 8 is a circuit diagram showing the structure of a Vccp generating circuit 46 of FIG. 2.

FIG. 8 is a circuit diagram showing the structure of the Vccp generating circuit 46 of FIG. 2.

Referring to FIG. 8, the Vccp generating circuit 46 includes a comparison circuit 112 for comparing the internal power supply potential Vccp with the reference potential Vrefp, and a P-channel MOS transistor 114 for supplying a current to the node receiving the internal power supply potential Vccp, according to the output of the comparison circuit 112. The P-channel MOS transistor 114 is connected between the node receiving the power supply potential Vcc and a node N18, and has its gate connected to a node N16.

The node N18 is an internal power supply node for outputting the internal power supply potential Vccp. The P-channel MOS transistor 114 receives the external power supply potential Vcc according to the output of the comparison circuit 112, and drives the internal power supply node. Accordingly, in the case where the reference potential Vrefp is output from a high output-impedance circuit, the internal power supply potential Vccp can be output as a potential approximately equal to the reference potential Vrefp, without any variation in reference potential Vrefp.

The comparison circuit 112 includes an N-channel MOS transistor 126 connected between a node N15 and the ground node and receiving the potential Vbias at its gate, an N-channel MOS transistor 120 connected between the nodes N15 and N16 and receiving the reference potential Vrefp at its gate, and a P-channel MOS transistor 118 connected between the node receiving the power supply potential Vcc and the node N16 and having its gate connected to a node N17.

The comparison circuit 112 further includes an N-channel MOS transistor 124 connected between the nodes N15 and N17 and having its gate connected to the node N18, and a P-channel MOS transistor 122 connected between the node receiving the power supply potential Vcc and the node N17 and having its gate connected to the node N17. The internal power supply potential Vccp is output from the node N18.

Figure 9:
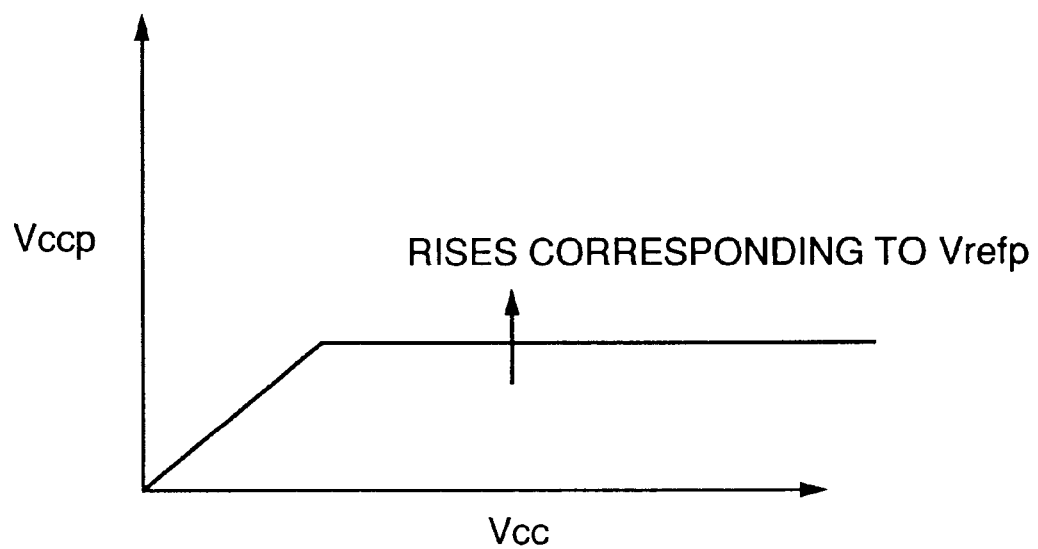
FIG. 9 is a diagram illustrating the operation of the Vccp generating circuit 46 of FIG. 8.

FIG. 9 is a diagram illustrating the operation of the Vccp generating circuit 46 of FIG. 8.

Referring to FIGS. 8 and 9, the comparison circuit 112 reduces the potential at the node N16 when the potential at the node N18 is lower than the reference potential Vrefp. In response to this, the P-channel MOS transistor 114 is rendered conductive, whereby a current flows into the node N18 through the P-channel MOS transistor 114, raising the potential at the node N18. When the potential at the node N18 exceeds the reference potential Vrefp, the comparison circuit 112 raises the potential at the node N16 so as to render the P-channel MOS transistor 114 nonconductive. Thus, a current corresponding to current consumption of the load circuitry connected to the node N18 is supplied through the P-channel MOS transistor 114 to the node N18, so that the potential at the node N18 is retained approximately at the reference potential Vrefp.

Accordingly, when the reference potential Vrefp is varied as a result of blowing a fuse in the constant current control circuit 42 or in the reference potential generating circuit 44, the internal power supply potential Vccp also varies correspondingly.

As has been described above, the semiconductor device of the first embodiment includes fuse elements in the constant current control circuit 42 in addition to those in the reference potential generating circuit 44 of FIG. 2 in order to adjust the internal power supply potential Vccp. For example, even if the threshold voltage of the P-channel MOS transistor 74, 80 or the like is varied, the internal power supply potential Vccp can be generated according to the set value. In other words, the internal power supply potential can be tuned to a normal value with improved probability over the conventional DRAM.

Accordingly, chips that conventionally result in defective products can be repaired.

Second Embodiment

Figure 10:
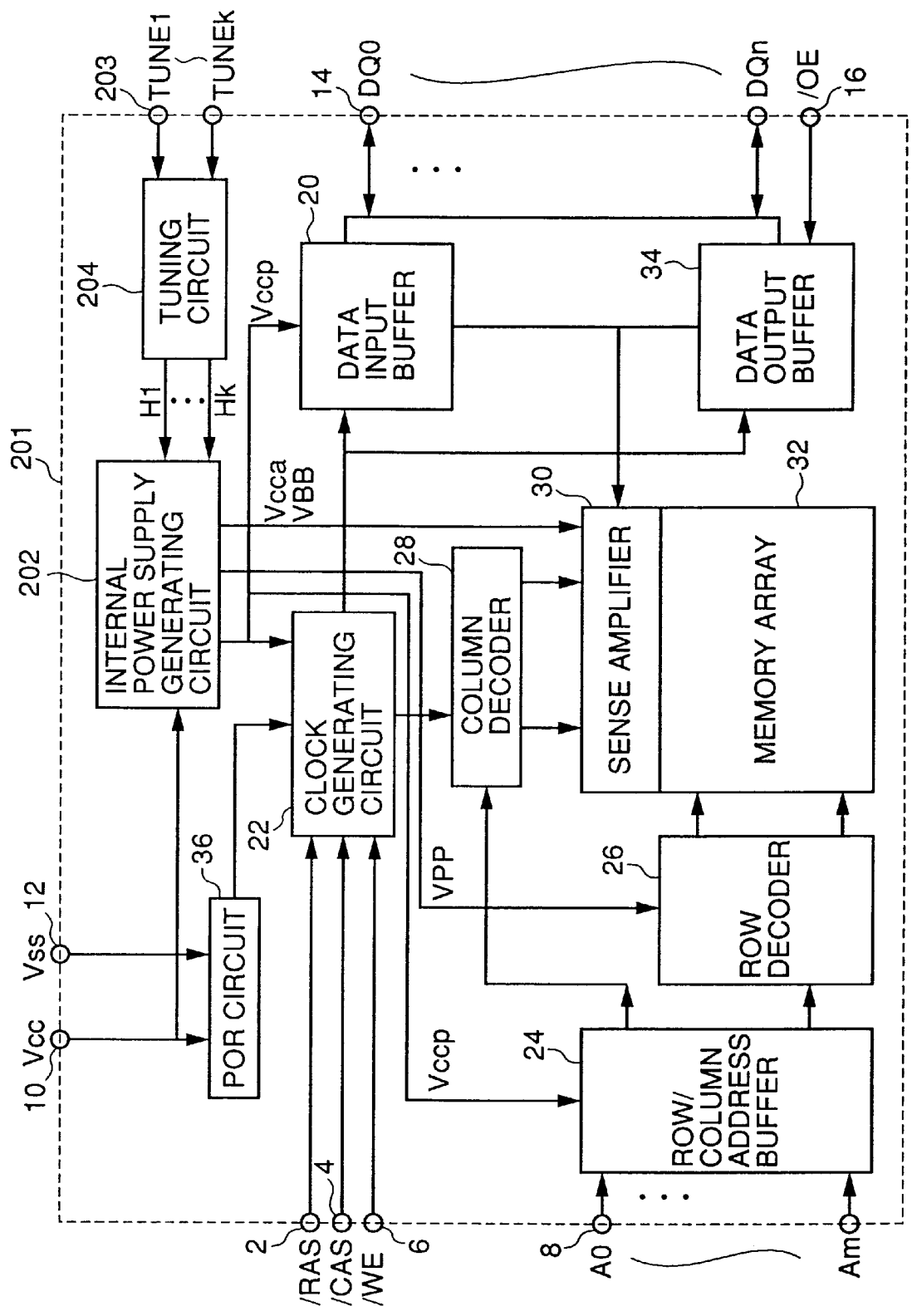
FIG. 10 is a schematic block diagram showing the structure of a semiconductor device 201 according to a second embodiment.

FIG. 10 is a schematic block diagram showing the structure of a semiconductor device 201 according to the second embodiment.

Referring to FIG. 10, the semiconductor device 201 is different from the semiconductor device 1 of FIG. 1 in that the semiconductor device 201 includes an internal power supply generating circuit 202 instead of the internal power supply generating circuit 38, and further includes a terminal group 203 for receiving tuning signals TUNE 1 to TUNEk from the outside, and a tuning circuit 204. The tuning circuit 204 receives the external tuning signals TUNE1 to TUNEk and outputs control signals H1 to Hk to the internal power supply generating circuit 202.

Since the structure of the semiconductor device 210 is otherwise the same as that of the semiconductor device 1 of FIG. 1, description thereof will not be repeated.

Figure 11:
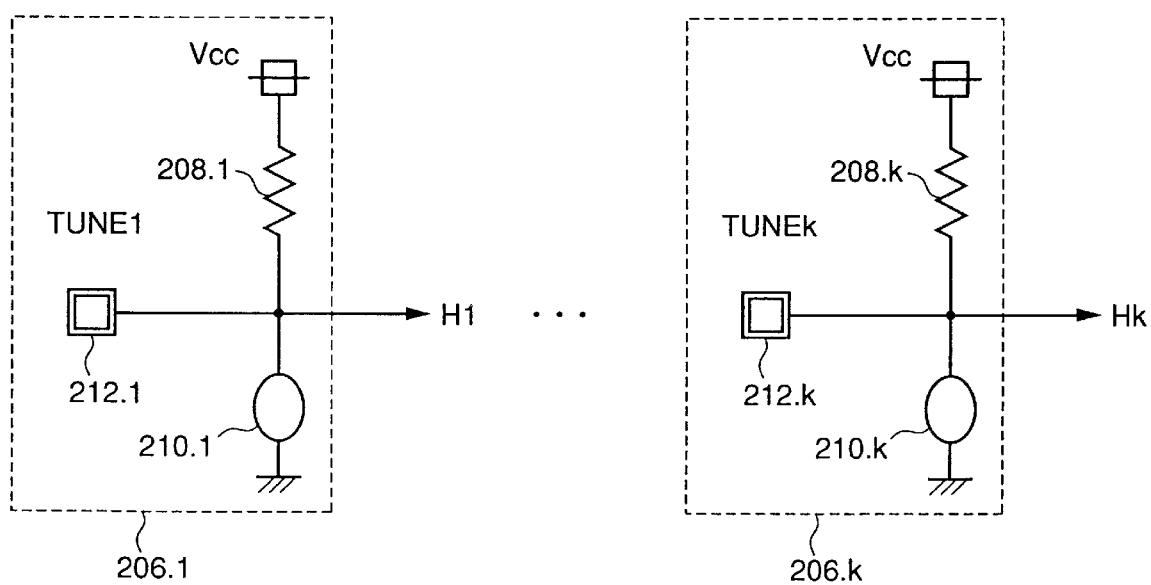
FIG. 11 is a circuit diagram showing the structure of a tuning circuit 204 of FIG. 10.

FIG. 11 is a circuit diagram showing the structure of the tuning circuit 204 of FIG. 10.

Referring to FIG. 11, the tuning circuit 204 includes tuning portions 206.1 to 206.k respectively corresponding to the tuning signals TUNEL to TUNEk.

The tuning portion 206.1 includes a resistance 208.1 and an electrical fuse 210.1 that are connected in series between the node receiving the power supply potential Vcc and the ground node, and a pad 212.1 connected to a connection node between the resistance 208.1 and the electrical fuse 210.1. The control signal H1 is output from the connection node between the resistance 208.1 and the electrical fuse 210.1.

The tuning portion 206.k includes a resistance 208.k and an electrical fuse 210.k that are connected in series between the node receiving the power supply potential Vcc and the ground node, and a pad 212.k connected to a connection node between the resistance 208.k and the electrical fuse 210.k. The control signal Hk is output from the connection node between the resistance 208.k and the electrical fuse 210.k.

Figure 12:
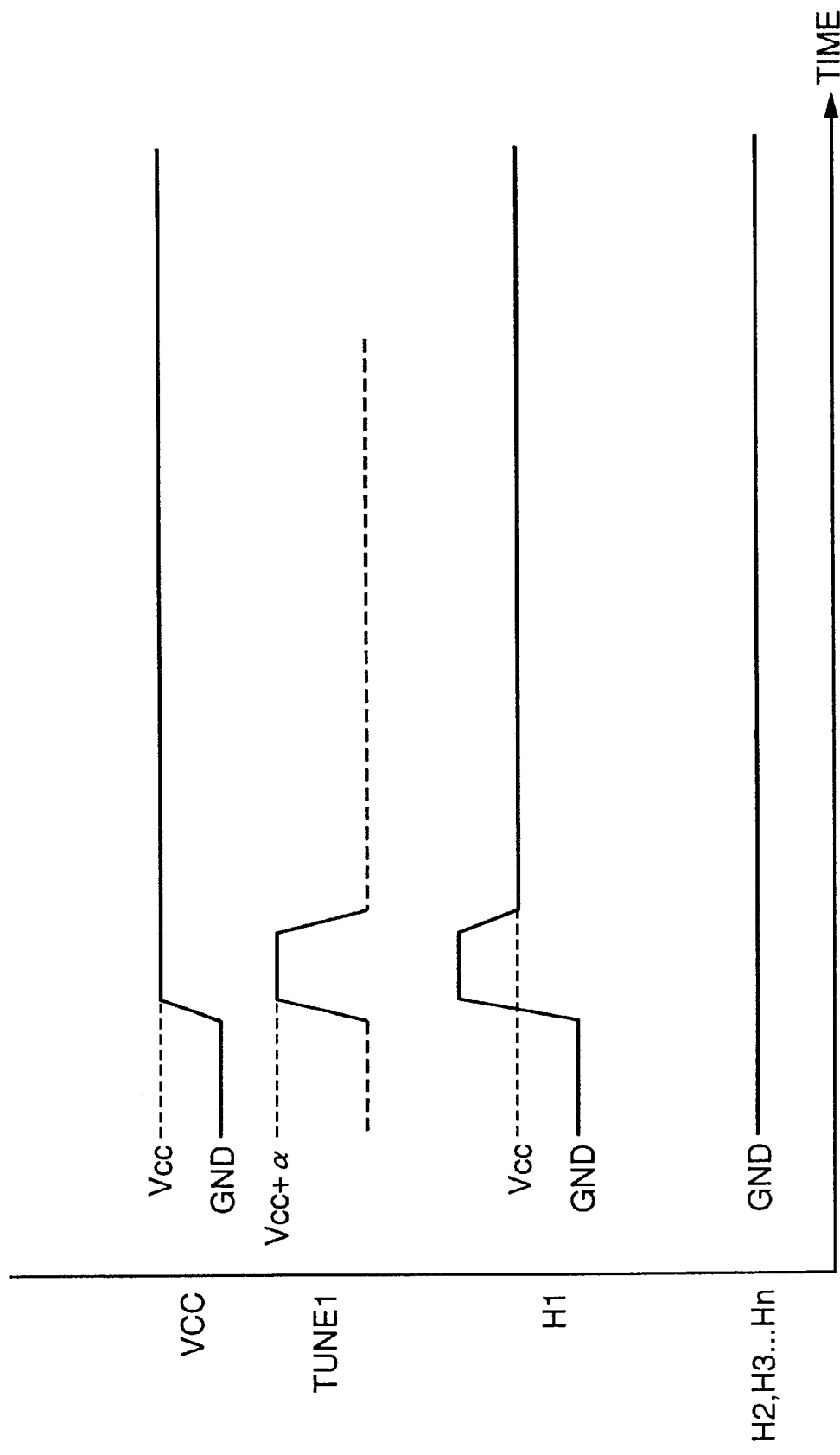
FIG. 12 is an operating waveform chart illustrating the operation of blowing electrical fuses 210.1 to 210.k of FIG. 11.

FIG. 12 is an operating waveform chart illustrating the operation of blowing the electrical fuses 210.1 to 210.k of FIG. 11.

Referring to FIG. 12, in order to blow, e.g., the electrical fuse 210.1, the H level potential of the signal TUNE1 to be applied to the pad 212.1 is set to a potential Vcc+α that is higher than the power supply potential Vcc. As a result, a current having a fixed value or more flows from the pad toward the ground node through the electrical fuse 210.1, whereby the electrical fuse 210.1 is blown. When the pad 212.1 is opened thereafter, the control signal H1 is retained at the power supply potential Vcc level by the resistance 208.1.

Figure 13:
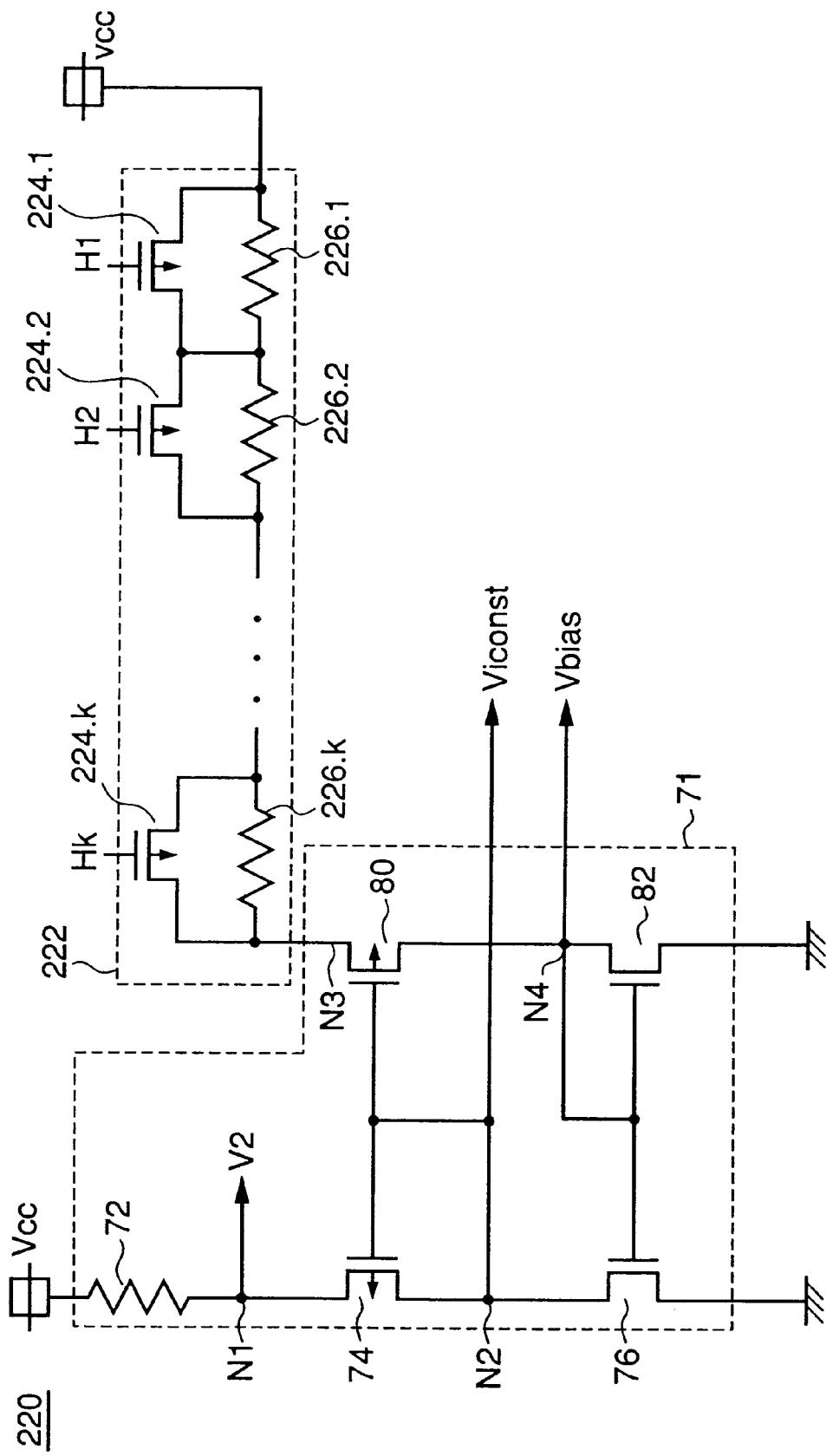
FIG. 13 is a circuit diagram showing the structure of a constant current control circuit 220 used in an internal power supply generating circuit 202 of FIG. 10.

FIG. 13 is a circuit diagram showing the structure of a constant current control circuit 220 used in the internal power supply generating circuit 202 of FIG. 10.

The internal power supply generating circuit 202 of the second embodiment is different from the internal power supply generating circuit 38 of FIG. 2 in that the internal power supply generating circuit 202 includes the constant current control circuit 220 instead of the constant current control circuit 42. Since the structure of the internal power supply generating circuit 202 is otherwise the same as that of the internal power supply generating circuit 38, description thereof will not be repeated.

Referring to FIG. 13, the constant current control circuit 220 includes a resistance circuit 222 instead of the resistance circuit 78 in the structure of the constant current control circuit 42 of FIG. 3. The resistance circuit 222 includes resistances 226.1 to 226.k connected in series between the node receiving the power supply potential Vcc and the node N3, and P-channel MOS transistors 224.1 to 224.k connected in parallel with the resistances 226.1 to 226.k, respectively. The P-channel MOS transistors 224.1 to 224.k receive the control signals H1 to Hk at their gates, respectively.

In other words, the resistance value of the resistance circuit 222 can be varied according to the values of the control signals H1 to Hk.

Figure 14:
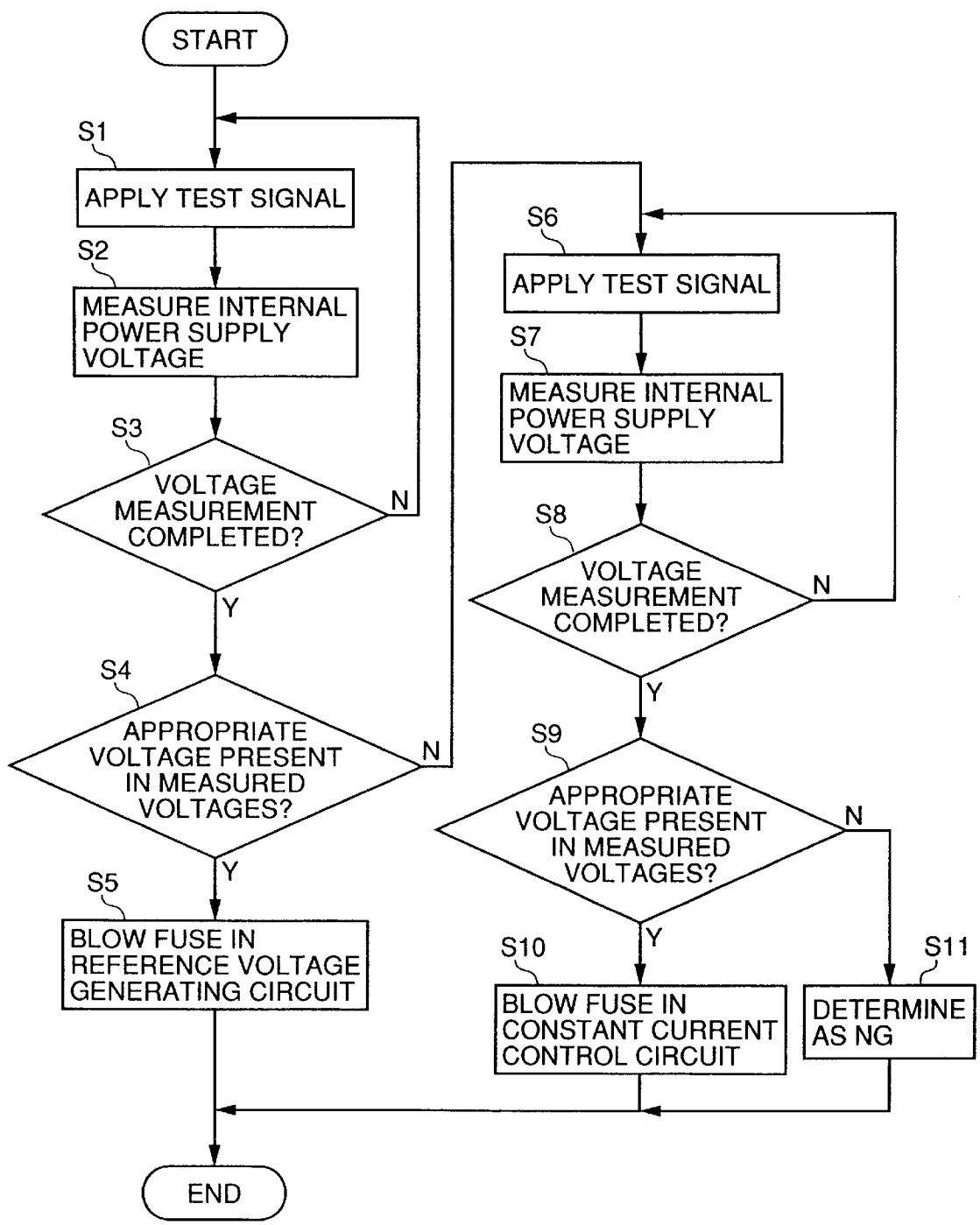
FIG. 14 is a flowchart illustrating the procedures for tuning an internal power supply potential in the semiconductor device of the second embodiment.

FIG. 14 is a flowchart illustrating the procedures of tuning the internal power supply potential in the semiconductor device of the second embodiment.

Referring to FIG. 14, it is first determined whether or not the reference potential generating circuit 44 for outputting the reference potential Vrefp is ready for adjustment. Then, it is determined whether or not the constant current control circuit 220 is ready for adjustment.

In Step S1, a test signal is applied to the pads 104 of FIG. 6 so as to selectively render some of the fuse circuits 98.1 to 98.j non-conductive. Then, in Step S2, the internal power supply voltage is measured with the pad 48.

Subsequently, it is determined in Step S3 whether or not required voltage measurement has been completed. In Steps S1 and S2, the data is acquired regarding how the internal power supply voltage varies when some of the fuses included in the fuse circuits 98.1 to 98.j of FIG. 5 are blown. Steps S1 and S2 are repeated until required data acquisition is completed.

When the required voltage measurement is completed, the process proceeds to Step S4. In Step S4, it is determined whether or not a target value of the internal power supply voltage is present in the measured voltages. If present, the process proceeds to Step S5. In Step S5, a fuse providing the target value is selected from the fuses included in the fuse circuits 98.1 to 98.j within the reference potential generating circuit, and then is blown. This blowing operation is conducted with reference to the measurement data of Step S2.

If an appropriate voltage is not present in the measured voltages in Step S4, the process proceeds to Step S6.

In Step S6, the tuning signals TUNE 1 to TUNEk are applied to the tuning circuit 204 of FIG. 10. In response to this, the potentials Viconst and Vbias that are output from the constant current control circuit 220 of FIG. 13 are varied, enabling a wider range of adjustment. Then, in Step S7, the internal power supply voltage is measured with the pad 48 of FIG. 2. Steps S6 and S7 are repeated for a required number of combinations of the tuning signals TUNE1 to TUNEk. When required voltage measurement is completed in Step S8, the process proceeds to Step S9. In Step S9, it is determined whether or not an appropriate voltage value is present in the measured internal voltages. If present, a fuse circuit is blown so as to fix the internal power supply voltage to the appropriate voltage. The fuse blowing operation is conducted by raising the voltage on the corresponding pad (212.1 to 212.k) receiving the tuning signal (TUNE1 to TUNEk) to a high voltage having a fixed value or more.

If the appropriate voltage is not present in the measure voltages, the process proceeds to Step S11, in which the semiconductor device is determined to be defective.

As has been described above, in the second embodiment, even if, e.g., the threshold voltage of the P-channel MOS transistor becomes lower than the assumed range due to process variation and the internal power supply potential is not generated normally, blowing of an electrical fuse (210.1 to 210.k) enables generation of the internal power supply potential. Thus, a larger number of chips can be repaired. Moreover, application of the tuning signals TUNE 1 to TUNEk from the terminals before blowing a fuse makes it possible to confirm how a fuse should be blown in order to repair the chip. Therefore, a fuse to be blown can be determined more reliably.

Third Embodiment

In the second embodiment, the tuning signals TUNE1 to TUNEk are applied from dedicated test terminals during wafer testing. However, in many cases, the semiconductor device is not allowed to leave a large number of such test terminals outside after the chip is mounted into a plastic package. Thus, conventionally, once the chip is mounted into the plastic package, the operation cannot be confirmed nor evaluated by varying the internal power supply potential.

In the third embodiment, a semiconductor device capable of varying the internal power supply potential for operation analysis even after the chip is mounted into a plastic package will be described.

Figure 15:
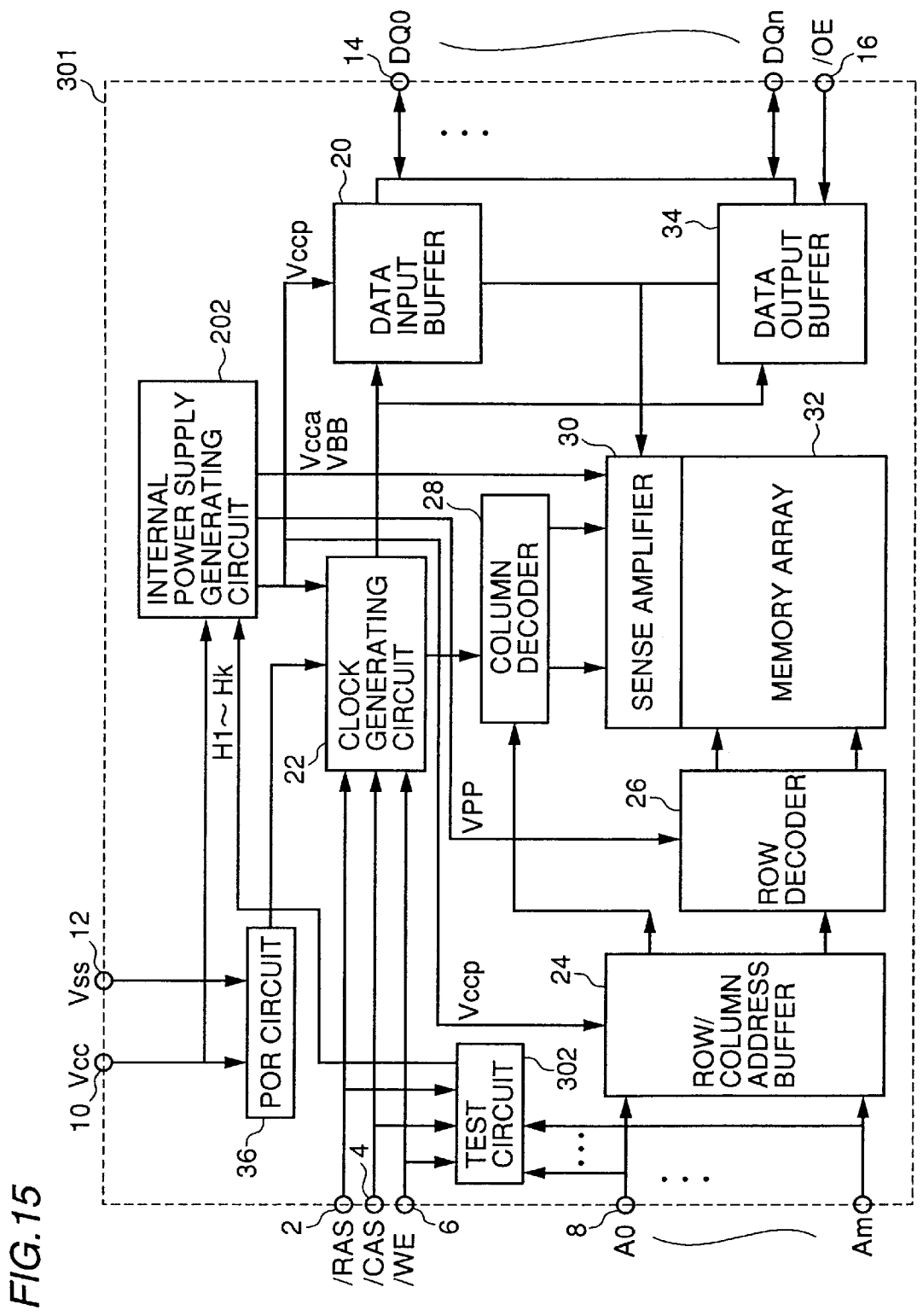
FIG. 15 is a schematic block diagram showing the structure of a semiconductor device 301 according to a third embodiment.

FIG. 15 is a schematic block diagram showing the structure of a semiconductor device 301 of the third embodiment.

Referring to FIG. 15, the semiconductor device 301 is different from the semiconductor device 201 of FIG. 10 in that the semiconductor device 301 includes a test circuit 302 instead of the tuning circuit 204. Since the structure of the semiconductor device 301 is otherwise the same as that of the semiconductor device 201, description thereof will not be repeated.

Upon detecting a test mode from a change in timing of the control signals /RAS, /CAS and /WE, the test circuit 302 applies control signals H1 to Hk to the internal power supply generating circuit 202 according to the address signals A0 to Am.

Figure 16:
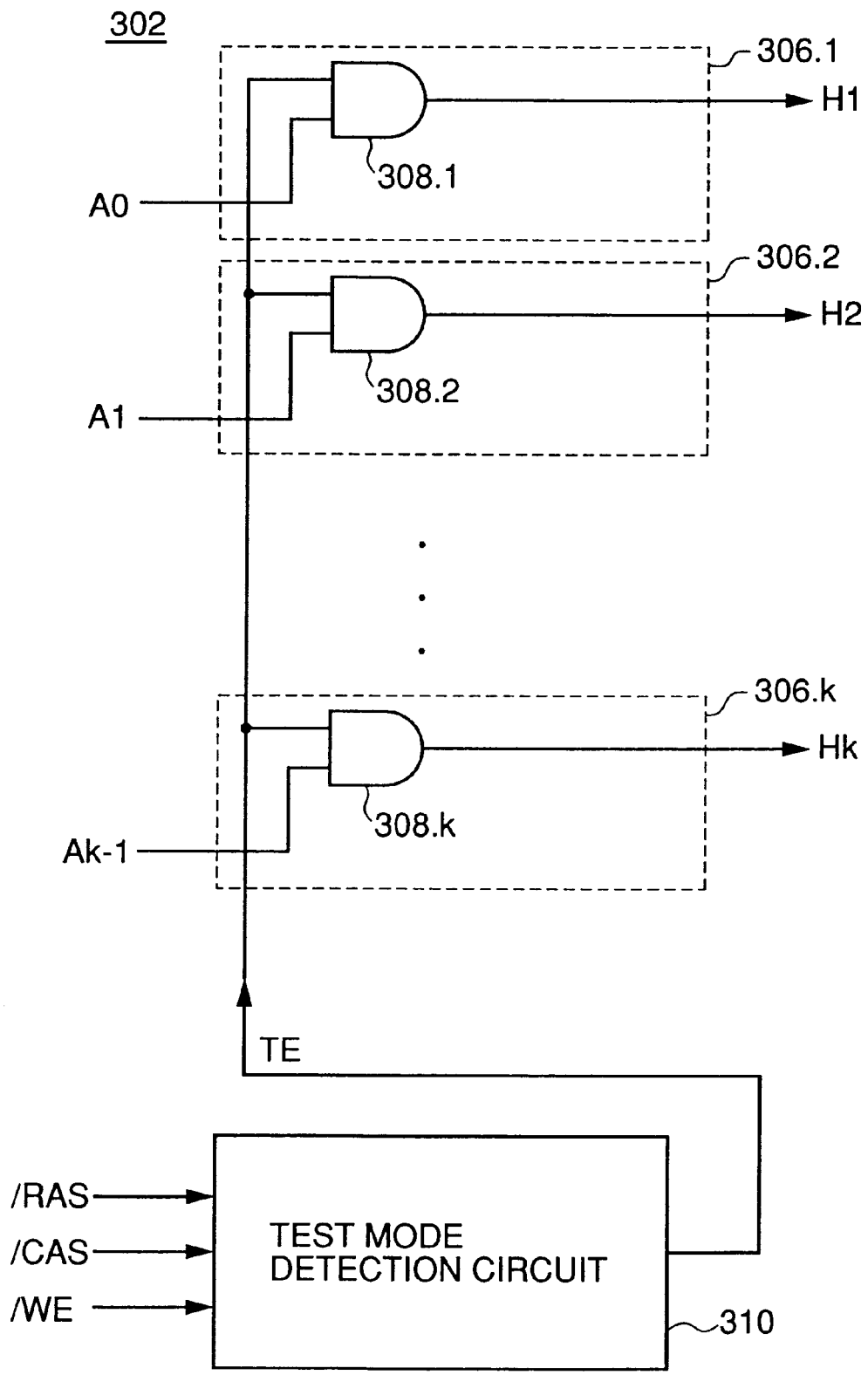
FIG. 16 is a circuit diagram showing the structure of a test circuit 302 of FIG. 15.

FIG. 16 is a circuit diagram showing the structure of the test circuit 302 of FIG. 15.

Referring to FIG. 16, the test circuit 302 includes a test mode detecting circuit 310 for detecting the test mode based on a change in the control signals /RAS, /CAS and /WE and activating a test signal TE, and control signal output portions 306.1 to 306.k for outputting the control signals H1 to Hk according to the address signals A0 to Ak-1 in response to activation of the test signal TE, respectively. The test signal TE is activated when the operation enters the test mode.

The control signal output portion 306.1 includes an AND circuit 308.1 for receiving the address signal A0 and test signal TE and outputting the control signal H1.

The control signal output portion 306.2 includes an AND circuit 308.2 for receiving the address signal A1 and test signal TE and outputting the control signal H2.

The control signal output portion 306.k includes an AND circuit 308.k for receiving the address signal Ak-1 and test signal TE and outputting the control signal Hk.

Note that the test circuit 302 uses the address signals A0 to Ak-1 in order to control the k control signals H1 to Hk, respectively. However, the test circuit 302 may alternatively use any k address signals selected from the address signals A0 to Am.

Figure 17:
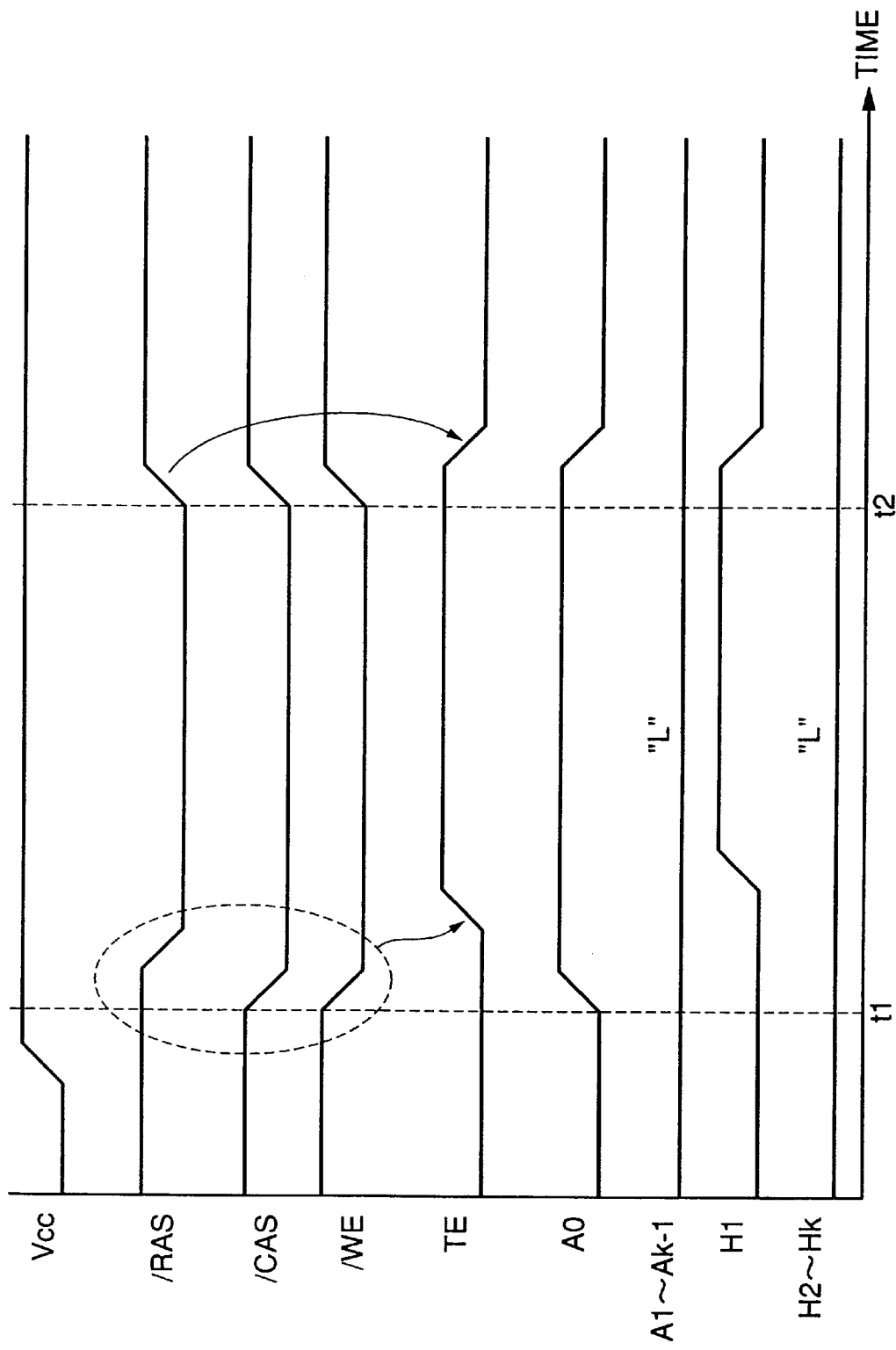
FIG. 17 is an operating waveform chart illustrating the operation of the test circuit 302 of FIG. 16.

FIG. 17 is an operational waveform chart illustrating the operation of the test circuit 302 of FIG. 16.

Referring to FIGS. 16 and 17, after the rise of the power supply potential Vcc, the address signal A0 rises to H level as well as the control signals /CAS and /WE fall at time t1. The control signal /RAS falls slightly after the fall of the control signals /CAS and /WE. In response to this, the test mode detection circuit 310 detects the test mode and raises the test signal TE to H level. Thus, both input signals of the AND circuit 308.1 are at H level, whereby the output of the AND circuit 308.1, i.e., the control signal H1, rises to H level. The control signals H2 to Hk are at L level since the address signals A1 to Ak-1 are at L level.

When prescribed analysis is completed, the control signals /RAS, /CAS and /WE are raised from L level to H level at time t2. In response to this, the test mode detection circuit 310 senses termination of the test mode and renders the test signal TE at L level.

As has been described above, the semiconductor device of the third embodiment is capable of varying the external control signals to be applied to the constant current control circuit even after the chip is mounted into the plastic package. Therefore, it is possible to conduct evaluation by varying the internal power supply potential level. For example, in the case where the threshold voltage of the P-channel MOS transistor 74, 80 of FIG. 13 becomes lower than the assumed value due to process variation, it is possible to remove the chips having a small operation margin by testing under strict test conditions, enabling improvement in product reliability. It is also possible to conduct evaluation for clarifying the cause of malfunction, by varying the internal power supply voltage.

Fourth Embodiment

In the third embodiment is shown the semiconductor device capable of varying the internal power supply voltage for evaluation even after the chip is mounted into the plastic package. However, it would be more desirable to repair the defective chips by further adjusting the internal power supply voltage.

Figure 18:
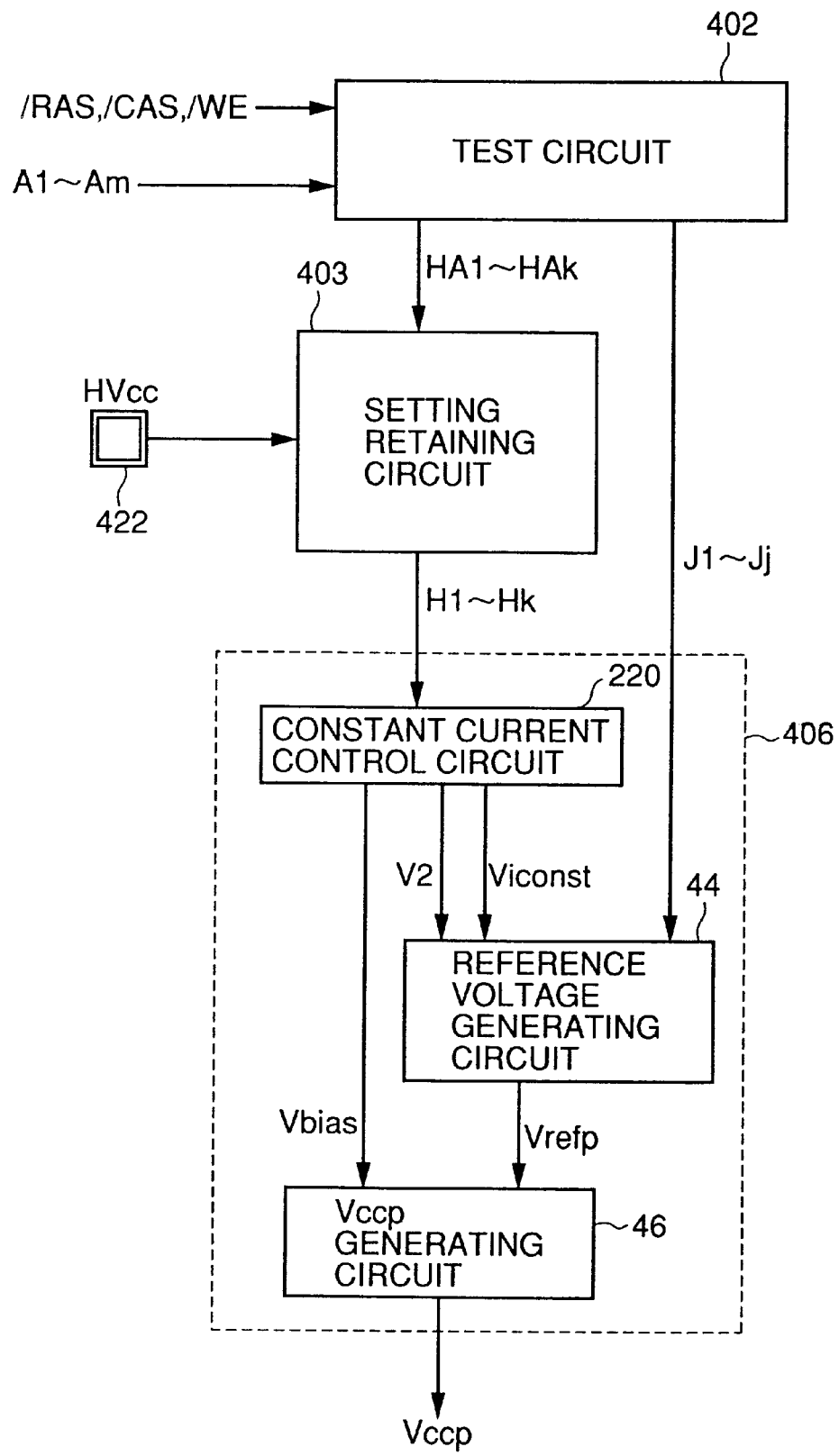
FIG. 18 is a schematic block diagram showing the structure associated with generation of an internal power supply potential in a semiconductor device according to a fourth embodiment.

FIG. 18 is a schematic block diagram showing the structure associated with generation of the internal power supply potential in a semiconductor device of the fourth embodiment.

Referring to FIG. 18, a test circuit 402 outputs control signals HA1 to HAk, j1 to Jj according to the control signals /RAS, /CAS, /WE and address signals A1 to Am. A setting retaining circuit 403 outputs control signals H1 to Hk according to the control signals HA1 to HAk, and is capable of retaining the setting of the control signals H1 to Hk in response to a high potential HVcc.

An internal power supply generating circuit 406 includes a constant current control circuit 220, reference potential generating circuit 44, and Vccp generating circuit 46, and is capable of adjusting an internal power supply potential Vccp according to the control signals H1 to Hk, j1 to Jj. The constant current control circuit 220 has the same structure as that of the constant current control circuit 42 of FIG. 2. Since the constant current control circuit 220, reference potential generating circuit 44 and Vccp generating circuit 46 have been described in FIGS. 13, 5 and 8, respectively, description thereof will not be repeated.

Figure 19:
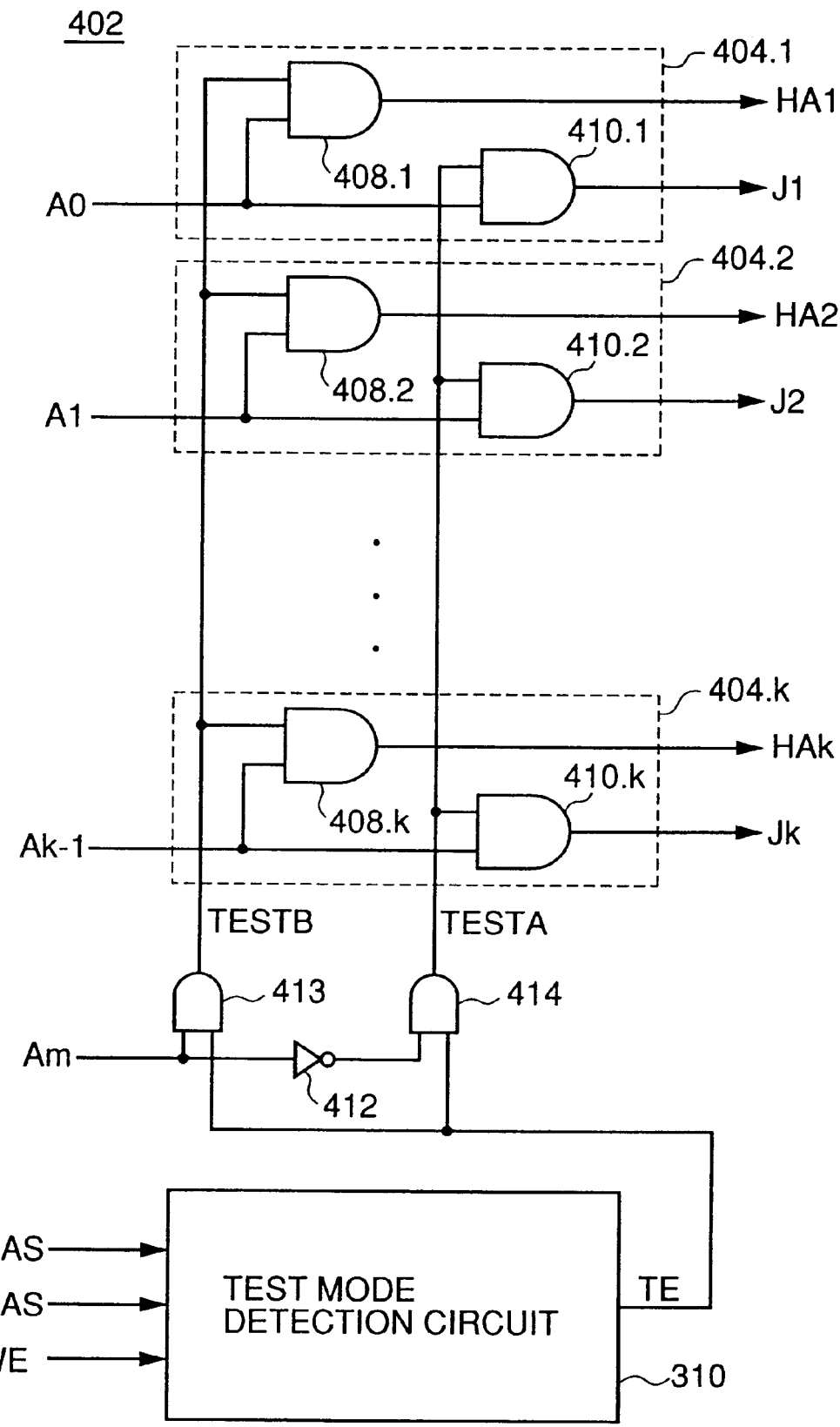
FIG. 19 is a circuit diagram showing the structure of a test circuit 402 of FIG. 18.

FIG. 19 is a circuit diagram showing the structure of the test circuit 402 of FIG. 18.

Referring to FIG. 19, the test circuit 402 includes a test mode detection circuit 310 for detecting a test mode according to a change in control signals /CAS, /RAS and /WE and activating a test signal TE, an AND circuit 413 for receiving the address signal Am and test signal TE and outputting a test signal TESTB, an miverter 412 for receiving and inverting the address signal Am, and an AND circuit 414 for receiving the output of the inverter 412 and the test signal TE and outputting a test signal TESTA.

The test circuit 402 further includes control signal output portions 404.1 to 404.k for outputting the control signals HA1 to HAk and j1 to Jk according to the address signals A0 to Ak-1, respectively.

The control signal output portion 404.1 includes an AND circuit 408.1 for receiving the test signal TESTB and address signal A0 and outputting the control signal HA1, and an AND circuit 410.1 for receiving the address signal A0 and test signal TESTA and outputting the control signal j1.

The control signal output portion 404.2 includes an AND circuit 408.2 for receiving the address signal A1 and test signal TESTB and outputting the control signal HA2, and an AND circuit 410.2 for receiving the address signal A1 and test signal TESTA and outputting the control signal J2.

The control signal output portion 404.k includes an AND circuit 408.k for receiving the address signal Ak-1 and test signal TESTB and outputting the control signal HAk, and an AND circuit 410.k for receiving the address signal Ak-1 and test signal TESTA and outputting the control signal Jk.

Figure 20:
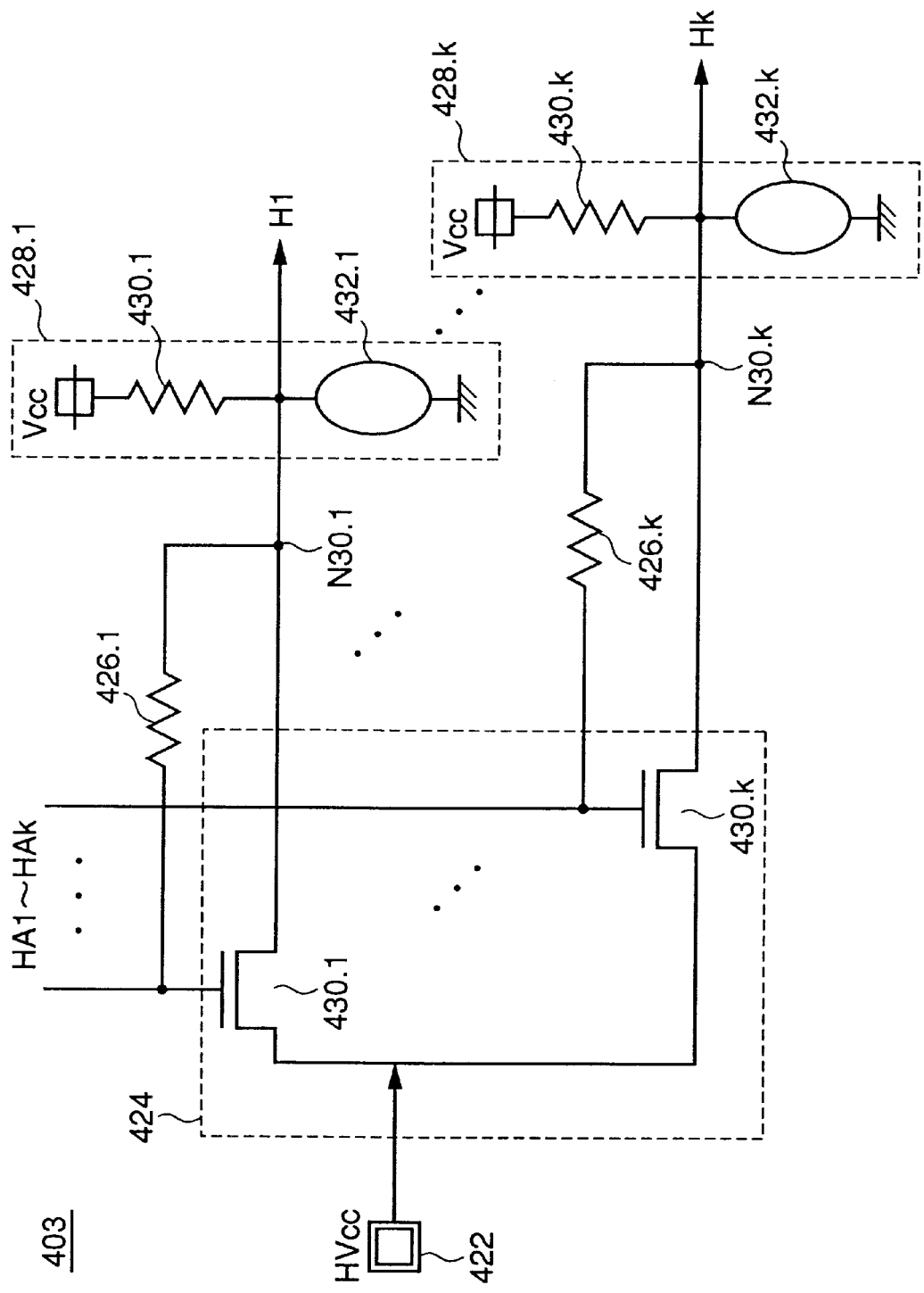
FIG. 20 is a circuit diagram showing the structure of a setting retaining circuit 403 of FIG. 18.

FIG. 20 is a circuit diagram showing the structure of the setting retaining circuit 403 of FIG. 18.

Referring to FIG. 20, the setting retaining circuit 403 includes a switch circuit 424 for applying the high potential Vcc applied to the pad 422 to nodes N30.1 to N30.k according to the control signals HA1 to HAm, resistances 426.1 to 426.k each connected between a node receiving the corresponding control signal HA1 to HAk and the corresponding node N30.1 to N30.k, and potential fixing portions 428.1 to 428.k for fixing the potential on the corresponding node N30.1 to N30.k to either H level or L level.

The switch circuit 424 includes N-channel MOS transistors 430.1 to 430.k each having its one end connected in common to the pad 422 and the other end connected to the respective node N30.1 to N30.k, and receiving the respective control signal HA1 to HAk at its gate.

The potential fixing portion 428.1 includes a resistance 430.1 connected between the node receiving the power supply potential Vcc and the node N30.1, and an electrical fuse 432.1 connected between the node N30.1 and the ground node. The potential fixing portion 428.k includes a resistance 430.k connected between the node receiving the power supply potential Vcc and the node N30.k, and an electrical fuse 432.k connected between the node N30.k and the ground node.

The control signals H1 to Hk are output from the nodes N30.1 to N30.k, respectively.

Figure 21:
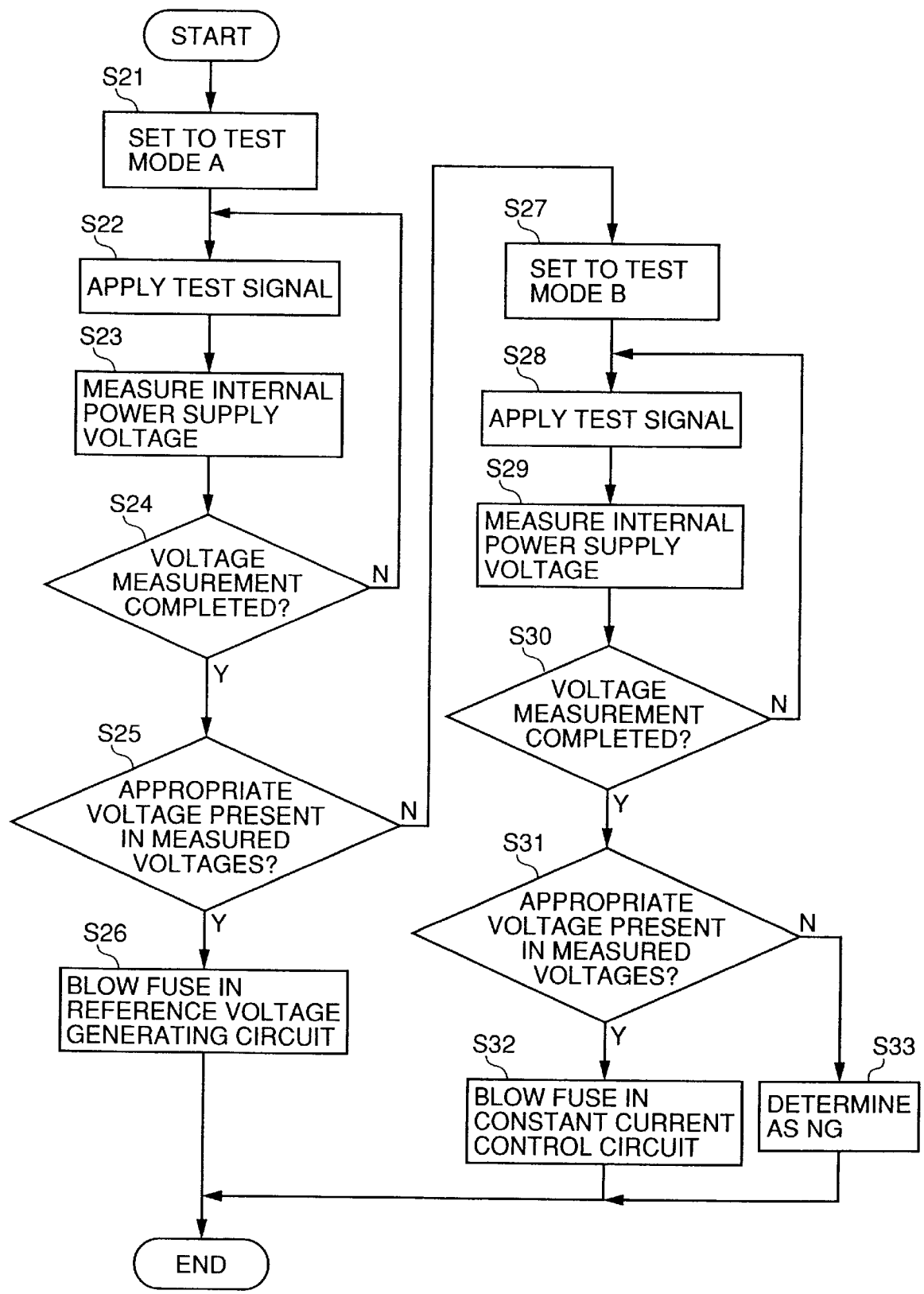
FIG. 21 is a flowchart illustrating the operation of adjusting an internal power supply voltage in the semiconductor device of the fourth embodiment.
Figure 22:
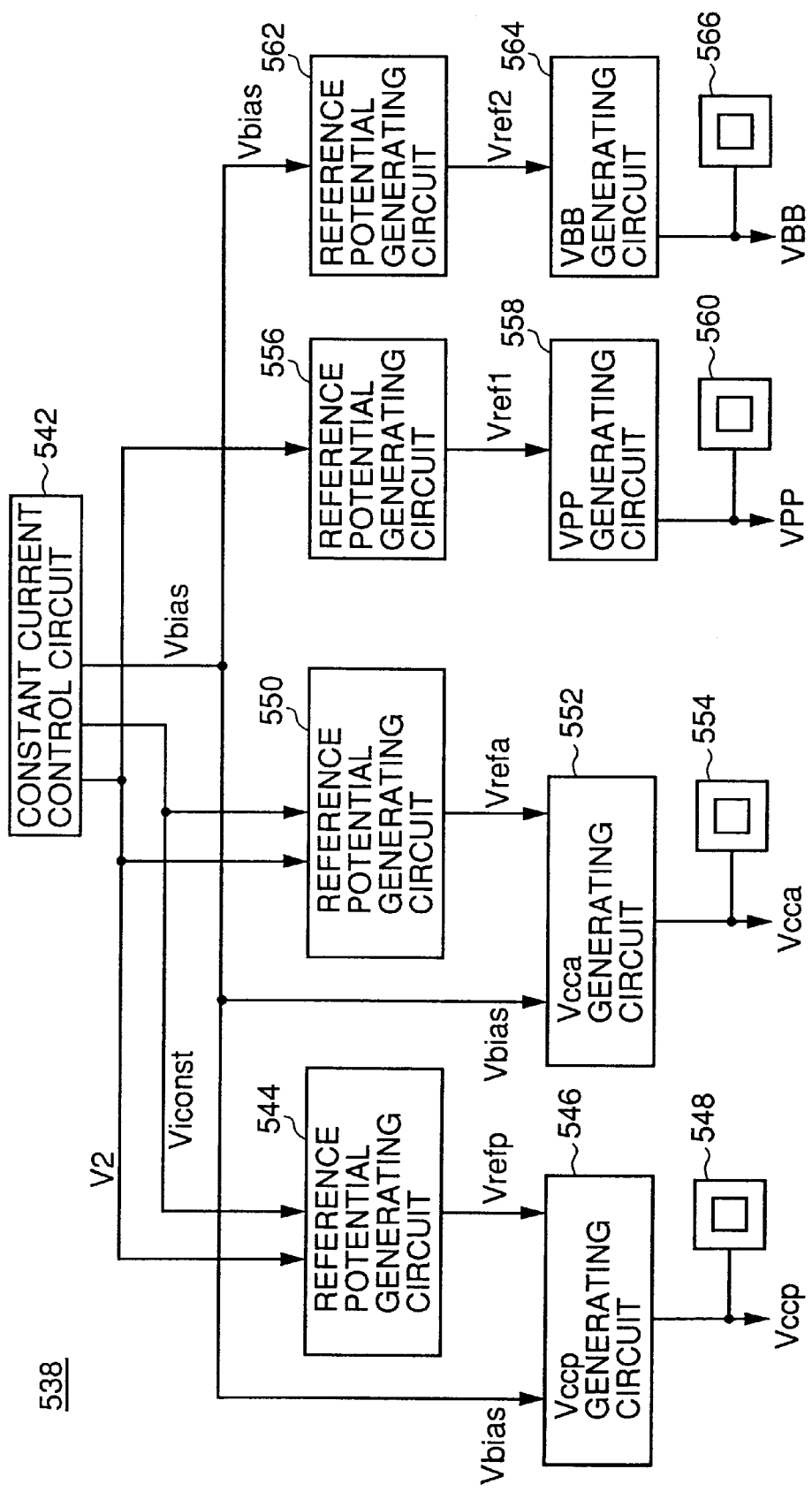
FIG. 22 is a block diagram showing the schematic structure of an internal power supply generating circuit 538 included in a conventional DRAM.
Figure 23:
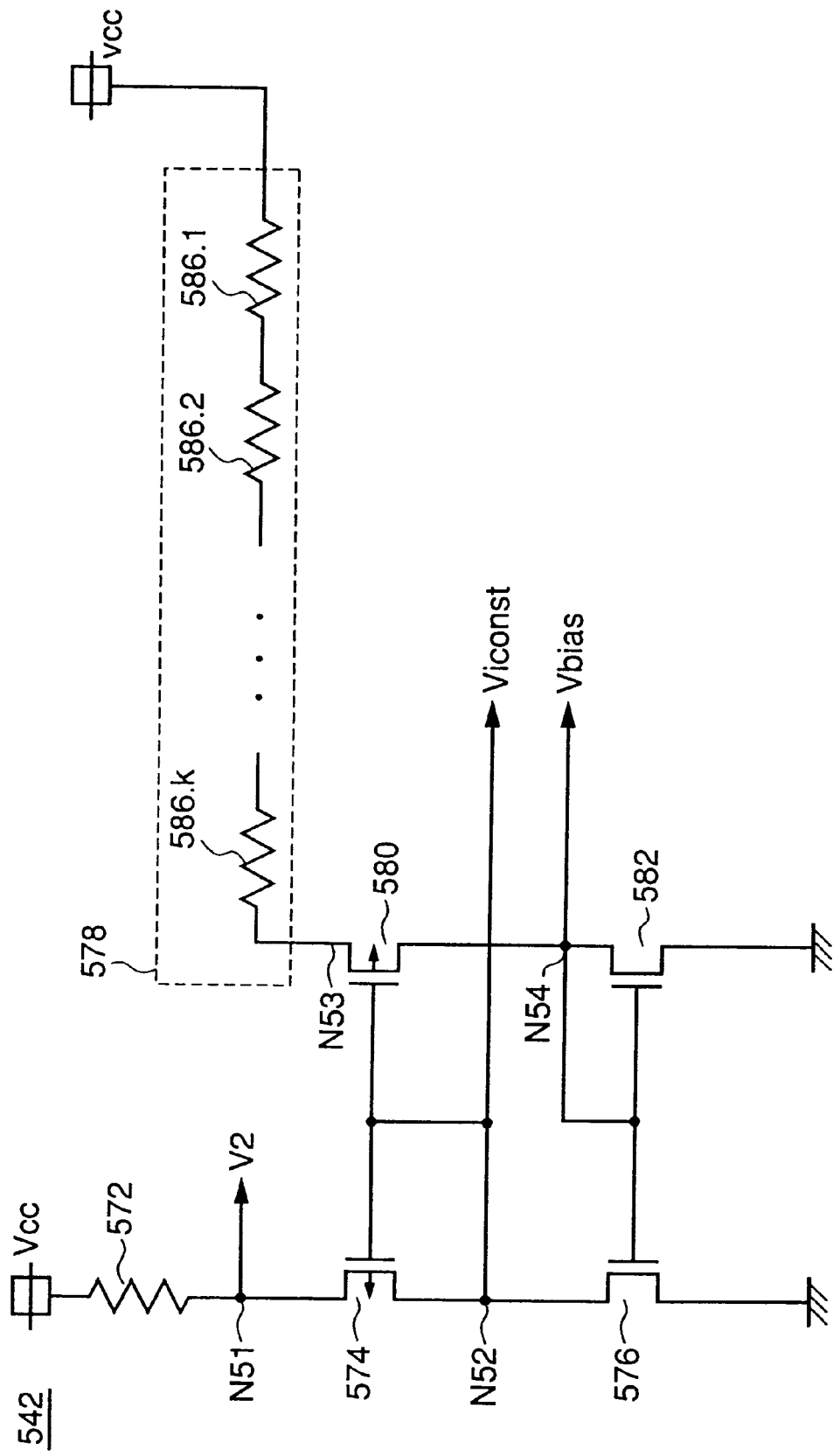
FIG. 23 is a circuit diagram showing the structure of a constant current control circuit 542 of FIG. 22.
Figure 24:
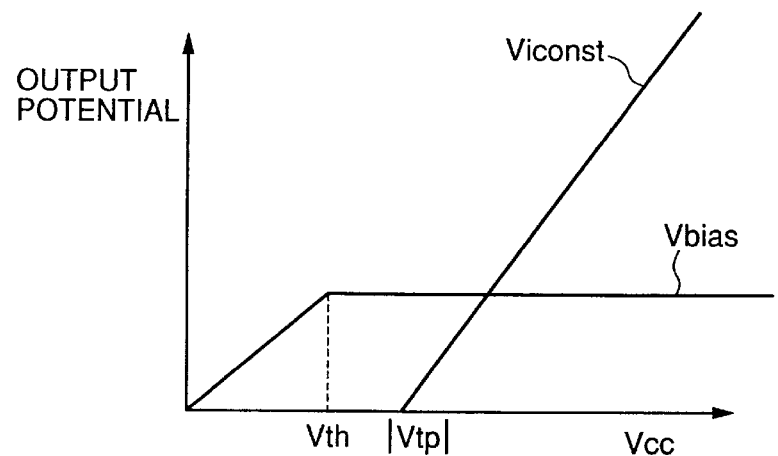
FIG. 24 is a diagram showing characteristics of output potentials of the constant current control circuit 542 of FIG. 23.
Figure 25:
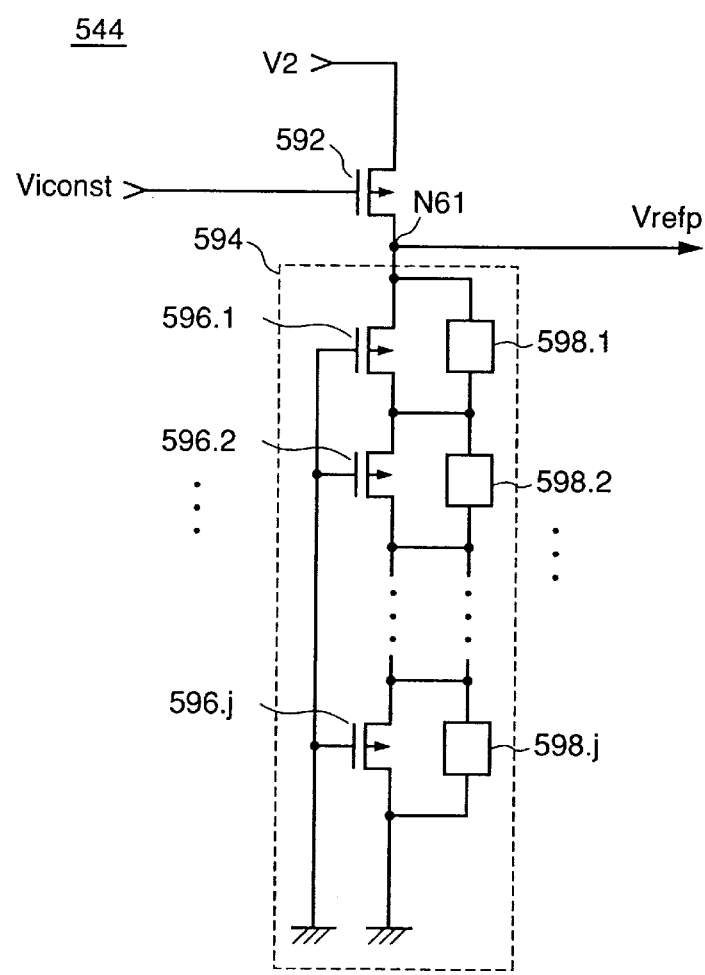
FIG. 25 is a circuit diagram showing the structure of a reference potential generating circuit 544 of FIG. 22.

FIG. 21 is a flowchart illustrating the operation of adjusting the internal power supply voltage in the semiconductor device of the fourth embodiment.

Referring to FIG. 21, the operation mode is first set to a test mode A in Step S21. The operation mode can be set to the test mode A by rendering the address signal Am at L level when the test mode detection circuit of FIG. 19 activates the test signal TE in response to a change in the control signals /RAS, /CAS and /WE. The test signal TESTA of FIG. 19 is activated in the test mode A. It is possible to control the control signals j1 to Jk by varying the address signals A0 to Ak-1.

First, the control signals j1 to Jj are set in Step S22 so as to selectively render some of the fuse circuits 98.1 to 98.j non-conductive. Then, in Step S23, the internal power supply voltage is measured with the pad 48.

Subsequently, it is determined in Step S24 whether or not required voltage measurement has been completed. In Steps S22 and S23, the data is acquired regarding how the internal power supply voltage varies when some of the fuses included in the fuse circuits 98.1 to 98.j of FIG. 5 are blown. Steps S22 and S23 are repeated until required data acquisition is completed.

When the required voltage measurement is completed, the process proceeds to Step S25. In Step S25, it is determined whether or not a target value of the internal power supply voltage is present in the measured voltages. If present, the process proceeds to Step S26. In Step S26, a corresponding fuse is selected from the fuses included in the fuse circuits 98.1 to 98.j within the reference potential generating circuit, and then is blown. This blowing operation is conducted with reference to the measurement data of Step S23.

If an appropriate voltage is not present in the measured voltages in Step S25, the process proceeds to Step S27.

In Step S27, the operation mode is set to a test mode B. The operation mode can be set to the test mode B by rendering the address signal Am at H level when the test mode detection circuit of FIG. 19 activates the test signal TE in response to a change in the control signals /RAS, /CAS and /WE. The test signal TESTB of FIG. 19 is activated in the test mode B. It is possible to control the control signals HA1 to HAk by varying the address signals A0 to Ak-1.

With the pad 422 being opened, the control signals HA1 to HAk are transmitted to the nodes N30.1 to N30.k through the resistances 426.1 to 426.k, respectively. Accordingly, it is possible to vary the control signals H1 to 14k according to the respective address signals (Step S28).

Then, the internal power supply voltage Vccp is measured in Step S29. If required voltage measurement has not been completed in Step S30, Steps S28 and S29 are repeated so that the control signals H1 to Hk are sequentially activated to measure the internal power supply voltage.

When the voltage measurement is completed in Step S30, the process proceeds to Stop S31. In step S31, it is determined weather or not an appropriate voltage is present in the measured voltages. If present, the process proceeds to Step S32, in which a corresponding fuse in the constant current control circuit is blown.

If the appropriate voltage is not present in the measured voltages in Step 31, the process proceeds to Step S33, in which the semiconductor device is determined to be defective.

As has been described above, the semiconductor device of the fourth embodiment is capable of blowing a fuse in the setting retaining circuit 403 from the outside by using an address signal. Accordingly, even after the chip is mounted into a plastic package, a device that is defective in terms of the internal power supply voltage can be repaired by adjusting the internal power supply potential.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor device, comprising;
    a constant current control circuit for receiving an external power supply potential and outputting a first reference potential, said constant current control circuit including
        a first resistance circuit having a first resistance value that is varied according to external setting, and
        a potential output portion for outputting said first reference potential according to said first resistance value;
    a reference potential generating circuit for outputting a second reference potential according to said first reference potential, said reference potential generating circuit including
        a constant current source for outputting a constant current according to said first reference potential, and
        a second resistance circuit connected between said constant current source and a ground node, for outputting said second reference potential by flowing said constant current therethrough; and
    an internal power supply driving circuit for receiving said power supply potential and driving an internal power supply node according to said second reference potential.

2. The semiconductor device according to claim 1, wherein
    said first resistance circuit includes
        a plurality of resistances connected in series between a first node and a power supply node receiving said external power supply potential, and
        a plurality of connection circuits respectively connected in parallel with said plurality of resistances and rendered conductive according to said setting, and
    said first resistance value is a resistance value between said power supply node and said first node.

3. The semiconductor device according to claim 2, wherein each of said plurality of connection circuits includes a fuse element connected in parallel with a corresponding one of said plurality of resistances and rendered non-conductive when being blown.

4. The semiconductor device according to claim 2, further comprising:
    a tuning circuit for tuning the resistance value of said first resistance circuit according to an external control signal, said tuning circuit including
        a terminal connected to an internal node, for receiving said external control signal,
        a resistance element for coupling said internal node to a first potential corresponding to a first set value, and
        a fuse element for coupling said internal node to a second potential corresponding to a second set value, said fuse element being blown when a potential difference between a potential at said terminal and said second potential exceeds a prescribed value, wherein
    one of said plurality of connection circuits includes a transistor connected in parallel with a corresponding one of said plurality of resistances and rendered conductive according to a potential at said internal node.

5. The semiconductor device according to claim 2, wherein
    said semiconductor device has a normal operation mode and a test operation mode, and further comprises:
        a test circuit for outputting an internal input signal according to an input signal in said normal operation mode, and outputting a control signal according to said input signal in said test operation mode; and
        an internal circuit for operating according to said internal input signal, and
    each of said plurality of connection circuits includes a transistor connected in parallel with a corresponding one of said plurality of resistances and rendered conductive according to said control signal.

6. The semiconductor device according to claim 5, further comprising:
    a terminal for receiving an external blow potential; and
    a setting retaining circuit for outputting an internal control signal according to said control signal and the potential at said terminal, said setting retaining circuit including
        a switch circuit for transmitting the blow potential applied to said terminal, according to said control signal,
        a signal transmitting portion for transmitting said control signal when the blow potential is not applied to said terminal, and
        a setting retaining portion for receiving respective outputs of said switch circuit and said signal transmitting portion at an internal node, and outputting said internal control signal according to a potential at said internal node, said setting retaining portion having
            a resistance element for coupling said internal node to a first potential corresponding to a first set value, and
            a fuse element for coupling said internal node to a second potential corresponding to a second set value, wherein
    said fuse element is selected according to said control signal, and blown when a potential difference between said blow potential and said second potential exceeds a prescribed value, and
    said transistor included in one of said plurality of connection circuits receives said internal control signal at its gate.

7. The semiconductor device according to claim 1, wherein
    said first resistance circuit has its one end connected to a power supply node receiving said external power supply potential, and
    said potential output portion includes
        a resistance connected between said power supply node and a first node,
        a first P-channel MOS transistor having its source connected to said first node, and its gate and drain connected to a second node outputting said first reference potential,
        a first N-channel MOS transistor connected between said second node and said ground node and having its gate connected to a third node, a second N-channel MOS transistor having its gate and drain connected to said third node and its source connected to said ground node, and a second P-channel MOS transistor connected between the other end of said first resistance circuit and said third node, and having its gate connected to said second node.

8. The semiconductor device according to claim 1, wherein said constant current source includes a MOS transistor receiving said first reference potential at its gate, and said second resistance circuit includes a plurality of resistance elements connected in series between a drain of said MOS transistor and a ground node, and a plurality of first connection circuits respectively connected in parallel with said plurality of resistance elements, and switched between conductive and nonconductive states according to a first internal control signal.

9. The semiconductor device according to claim 8, wherein said semiconductor device has a normal operation mode, and first and second test operation modes, and said semiconductor device further comprising:

a test circuit for outputting an internal input signal according to an input signal in said normal operation mode, outputting said first internal control signal according to said input signal in said first test operation mode, and outputting a second internal control signal according to said inpus signal in said second test operation mode; and an internal circuit for operating according to said internal input signal, and wherein a resistance value of said first resistance circuit varies according to said second internal control signal.

10. The semiconductor device according to claim 1, wherein said internal power supply driving circuit includes a comparison circuit for comparing said second reference potential with a potential at said internal power supply node, and a transistor connected between a power supply node receiving said external power supply potential and said internal power supply node, and rendered conductive according to an output of said comparison circuit.

* * * * *

UNITED STATES PATENT AND TRADEMARK OFFICE
CERTIFICATE OF CORRECTION

PATENT NO.    : 6,417,726 B1  Page 1 of 1
DATED         : July 9, 2002
INVENTOR(S)   : Osamu Kitade It is certified that error appears in the above-identified patent and that said Letters Patent is hereby corrected as shown below:

<u>Title page,</u>
Item [73], Assignee, change "Mitsubish Denki Kabushiki Kaisha" to -- Mitsubishi Denki Kabushiki Kaisha --

Signed and Sealed this

Eighteenth Day of February, 2003

JAMES E. ROGAN
*Director of the United States Patent and Trademark Office*